(12) United States Patent
Murade

(10) Patent No.: US 6,809,338 B2
(45) Date of Patent: Oct. 26, 2004

(54) ELECTRO-OPTICAL DEVICE

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/602,731

(22) Filed: Jun. 25, 2003

(65) Prior Publication Data

US 2004/0004221 A1 Jan. 8, 2004

Related U.S. Application Data

(62) Division of application No. 09/809,275, filed on Mar. 16, 2001, now Pat. No. 6,610,997.

(30) Foreign Application Priority Data

Mar. 17, 2000 (JP) ..................................... 2000-077171
Mar. 17, 2000 (JP) ..................................... 2000-077173
Jan. 16, 2001 (JP) ..................................... 2000-007910

(51) Int. Cl.[7] ..................... H01L 29/04; H01L 31/036; H01L 31/0232; G02F 1/136
(52) U.S. Cl. ..................... 257/72; 257/59; 257/306; 257/435; 349/43; 349/111
(58) Field of Search ..................... 257/59, 72, 296, 257/306, 435; 349/42, 43, 110, 111

(56) References Cited

U.S. PATENT DOCUMENTS

| | | |
|---|---|---|
| 5,459,596 A | 10/1995 | Ueda et al. |
| 5,510,916 A | 4/1996 | Takahashi |
| 5,940,059 A | 8/1999 | Lee et al. |
| 6,066,860 A | 5/2000 | Katayama et al. |
| 6,075,580 A | 6/2000 | Kouchi |
| 6,108,056 A | 8/2000 | Nakajima et al. |
| 6,172,721 B1 | 1/2001 | Murade et al. |
| 6,320,204 B1 | 11/2001 | Hirabayashi et al. |
| 6,610,997 B2 * | 8/2003 | Murade ........................ 257/72 |

FOREIGN PATENT DOCUMENTS

| | | |
|---|---|---|
| JP | 02-165125 | 6/1990 |
| JP | 4-333828 | 11/1992 |
| JP | 04-348324 | 12/1992 |
| JP | 7-28093 | 1/1995 |
| JP | 2000-10120 | 1/2000 |

* cited by examiner

*Primary Examiner*—Gene M. Munson
(74) *Attorney, Agent, or Firm*—Oliff & Berridge, PLC

(57) ABSTRACT

An electro-optical device includes a TFT, a data line, a scanning line, and a pixel electrode, which are provided above a substrate, a semiconductor layer which constitutes the TFT being connected to the pixel electrode through a relay film. A light-shielding conductive film provided between the data line and the relay film is electrically connected to a capacitor electrode which consists of the same film as the scanning line provided between the relay film and the semiconductor layer at a constant potential, thereby forming a storage capacitor between the films. Therefore, in an electro-optical device of a type in which a light-shielding film against incident light is provided above pixel switching TFT, and a light-shielding film against return light is provided below the TFT, the pixel aperture ratio can be increased, and the storage capacitor can be enlarged.

31 Claims, 22 Drawing Sheets

ELECTRO-OPTICAL DEVICE

This is a Divisional of application Ser. No. 09/809,275, filed Mar. 16, 2001, now U.S. Pat. No. 6,610,997.

BACKGROUND OF THE INVENTION

1. Field of Invention

The present invention relates to the technical field of an active matrix driving system electro-optical device. Particularly, the present invention relates to the technical field of an electro-optical device which includes a pixel electrode and a pixel switching thin film transistor (referred to as "TFT" hereinafter), which are provided with electrical conduction therebetween, and a storage capacitor and a light-shielding film which are provided in a laminated structure formed on a substrate.

2. Description of Related Art

In a conventional electro-optical device such as a TFT-driven active matrix driving system liquid crystal device, a scanning signal is supplied to a gate electrode of a TFT through a scanning line to turn the TFT on, and an image signal supplied to a source region of a semiconductor layer through a data line is supplied to a pixel electrode through the region between the source and drain of the TFT. Such an image signal is supplied to each of a plurality of pixel electrodes for only a short time through each of a plurality of TFTs. Therefore, in order to hold the voltage of the image signal supplied through a TFT over a longer time than the time of the on state, a storage capacitor is generally added to each pixel electrode.

When light is incident on at least a portion of a channel region or junction regions between the channel region and source-drain regions, and the source-drain regions adjacent to the junction regions in a semiconductor layer which constitutes the TFT, light excitation occurs to change the transistor properties of the TFT, for example, increase a leakage current in the on state. Therefore, for example, in an electro-optical device of a type in which strong light is incident, such as a transmissive electro-optical device for a projector, in order to prevent such a change in the properties of the TFT with light incidence, a light-shielding film is provided on a counter substrate on the incidence side of incident light to cover the space between the pixel electrodes including the channel region of the TFT, or an opaque wide data line which includes an Al film or the like is formed to cover the channel region. Furthermore, on the outgoing side, a light-shielding film is provided below the TFT to shield light reflected by the back, and returned light such as incident light from another electro-optical device, which passes through a synthesis optical system, in a projector that includes a combination of a plurality of electro-optical devices.

SUMMARY OF THE INVENTION

In this type of electro-optical device, improvement in quality of a display image is strongly demanded, and in order to satisfy this demand, it is important that a pixel aperture region of each pixel through which display light is transmitted is widened relative to a non-pixel aperture region through which display light is not transmitted, to increase the pixel aperture ratio while decreasing the pixel pitch, and enlarge a storage capacitor added to each pixel electrode.

The storage capacitor is generally formed by utilizing the non-pixel aperture region, and it is thus basically difficult to form the storage capacitor in the pixel aperture region. Therefore, the non-pixel aperture region where the storage capacitor can be formed is narrowed as the pixel aperture region is widened to increase the pixel aperture ratio. However, there is a problem in which the pixel aperture ratio is decreased as the non-pixel aperture region is widened to enlarge the storage capacitor.

It is also very important to sufficiently shield incident light and reflected light in a channel region of TFT or a region (referred to as the "adjacent region of channel" hereinafter) adjacent to the channel region, for example, a lightly-doped region of LDD structure TFT, as described above. Namely, a decrease in the pixel pitch causes significant deterioration in image quality resulting from only a slight change in properties of TFT.

However, a total plane region where a light-shielding film or a film having a light shielding function can be arranged is narrowed by increasing the pixel aperture ratio, thereby causing the problem of causing difficulties in completely shielding TFT from light. Furthermore, a decrease in the pixel pitch causes a problem in which even with incident light or reflected light slightly inclined with the substrate surface, light finally enters the channel region or the adjacent region of channel due to the occurrence of multiple reflection in a laminated structure after oblique incidence. Particularly, when the incidence side is covered with a data line which includes an Al film having high reflectance, shielding against incident light approaches perfection with widening of the data line, but widening the data line conversely causes a problem difficult to resolve in which reflected light is reflected by the side facing TFT or subsequently reflected by the TFT-facing surface of a light-shielding film formed below TFT, and the light is likely to be finally incident on the channel region or the adjacent region of channel. Furthermore, shielding against reflected light approaches perfection with widening of the light-shielding film formed below TFT, but widening the light-shielding film formed below TFT causes a problem difficult to resolve in which oblique incident light is reflected by the inner surface of the light-shielding film, or subsequently reflected by the inner surfaces of the data line, and is likely to be finally incident on the channel region or the adjacent region of channel. Particularly, in an electro-optical device for a projector which uses incident light or reflected light having very high intensity per unit region, the above problems are very important for improving image quality.

The present invention has been achieved at least in consideration of the above problems, and an object of the present invention is to provide an electro-optical device in which a pixel aperture ratio can be increased, a storage capacitor can be enlarged, and a high quality image can be displayed.

Another object of the present invention is to provide an electro-optical device in which a change in properties of pixel switching TFT due to incident light or reflected light can be decreased while increasing the pixel aperture ratio, and a high quality image can be displayed.

(1) In a first exemplary aspect of the present invention, an electro-optical device may include a scanning line formed above a substrate, a data line crossing the scanning line, a thin film transistor connected to the scanning line and the data line, a pixel electrode connected to a drain region of the thin film transistor, and a first storage capacitor formed by a plurality of layers between the scanning line and the data line.

In this exemplary embodiment of the present invention, the first storage capacitor is formed by a plurality of layers between the scanning line and the data line by utilizing the laminated structure to enlarge the storage capacitor, thereby providing an electro-optical device capable of displaying a high quality image.

(2) In another exemplary embodiment of the first aspect of the invention, in the electro-optical device, the first storage capacitor may include a first capacitor electrode, an insulating film facing the first capacitor electrode, and a second capacitor electrode opposed to the first capacitor electrode with the insulating film provided therebetween to serve as a relay film for electrically connecting a drain region of the thin film transistor and the pixel electrode.

In this exemplary embodiment of the present invention, the second capacitor electrode which forms the first storage capacitor is formed as the relay film for electrically connecting the drain region of the thin film transistor and the pixel electrode, whereby the problem of causing a difficulty in electrically connecting the pixel electrode and a semiconductor layer due to a long distance therebetween can be solved. Also, the second capacitor electrode can prevent etching penetration during the formation of a contact hole.

(3) In still another exemplary embodiment of the first aspect of the present invention, in the electro-optical device, the first storage capacitor is formed to overlap with each of the semiconductor layers of the thin film transistor and the scanning line, except the connection region between the source region of the thin film transistors and the data line.

In this exemplary embodiment of the present invention, since the storage capacitor is formed to overlap with each of the semiconductor layers and the scanning line, it is possible to increase the pixel aperture ratio, and to enlarge the storage capacitor.

(4) In a further exemplary embodiment of the first aspect of the present invention, the electro-optical device may further include a second storage capacitor which may include a second capacitor electrode, an insulating film facing the second capacitor electrode, and a third capacitor electrode opposed to the second capacitor electrode with the insulating film provided therebetween and consisting of the same film as the scanning line.

In this exemplary embodiment of the present invention, since the second storage capacitor is formed by using the second capacitor electrode, which forms the first storage capacitor, and the scanning line layer, storage capacitors can be laminated in the thickness direction of the substrate, and even with narrow pixel pitch, a relatively large storage capacitor can be formed in a non-aperture region. In addition, the third capacitor electrode may include the same film as the scanning line, storage capacitors can thus be formed by a laminated structure which may consist of a relatively small number of layers, (5) In a still further exemplary embodiment of the first aspect of the present invention, in the electro-optical device, the third capacitor electrode is formed in parallel with the scanning line except in the connection region between the drain region of the thin film transistor and the second capacitor electrode.

In this exemplary embodiment of the present invention, since the third capacitor electrode is formed in parallel with the scanning line, a storage capacitor can be formed by utilizing the non-aperture region.

(6) In a further exemplary embodiment of the first aspect of the present invention, in the electro-optical device, the third capacitor electrode is electrically connected to the first capacitor electrode.

In this exemplary embodiment of the present invention, no potential variation occurs between the first capacitor electrode and the third capacitor electrode, whereby the possibility of affecting the properties of the thin film transistors can be prevented.

(7) In a further exemplary embodiment of the first aspect of the present invention, in the electro-optical device, the electrical connection between the third capacitor electrode and the first capacitor electrode is located in a region below the data line.

In this exemplary embodiment of the present invention, the space between the pixel electrodes, which are located below the data line and which cannot be used as an aperture region for each pixel, is used for connecting the third capacitor electrode and the first capacitor electrode, thereby causing an advantage for improving the pixel aperture ratio.

(8) In a further exemplary embodiment of the first aspect of the present invention, in the elcctro-optical device, the third capacitor electrode may include a part of a first capacitor line extending along the scanning line, the first capacitor electrode may include a part of a second capacitor line extending along the scanning line, and the first and second capacitor lines are extended to the periphery of the image display region in which the pixel electrode is arranged, and electrically connected to each other.

In this exemplary embodiment of the present invention, the first capacitor line arranged along the scanning line and including a plurality of third capacitor electrodes, and the second capacitor line arranged along the scanning line and including a plurality of first capacitor electrodes are electrically connected to each other outside the image display region to permit relatively simple and secure electrical connection between the third capacitor electrodes and the first capacitor electrodes through the first and second capacitor lines. Also, contact holes need not be provided for connecting both capacitor electrodes in the image display region, and thus the storage capacitors can be enlarged.

(9) In a further exemplary embodiment of the first aspect of the present invention, the electro-optical device may further include a third storage capacitor comprising the third capacitor electrode, an insulating film facing the third capacitor electrode, and a fourth capacitor electrode opposed to the third capacitor electrode with the insulating films provided therebetween and which may consist of the same film as the semiconductor layer.

In this exemplary embodiment of the present invention, the third storage capacitor is formed by using the third capacitor electrode, which constitutes the second storage capacitor, and the semiconductor layer, and storage capacitors can thus be laminated in the thickness direction of the substrate, thereby permitting the construction of a relatively large storage capacitor in the non-aperture region, even when the pixel pitch is decreased. Also, the fourth capacitor electrode may include the same film as the semiconductor layer, and thus storage capacitors can be constructed by a laminated structure which may include a relatively small number of layers.

(10) In a further exemplary embodiment of the first aspect of the present invention, in the electro-optical device, the fourth capacitor electrode is formed to extend from the drain region of the thin film transistor.

In this exemplary embodiment of the present invention, a storage capacitor can be formed by using the drain region of the thin film transistor.

(11) In a further exemplary embodiment of the first aspect of the present invention, in the electro-optical device, the fourth capacitor electrode is formed in parallel with the scanning line.

In this exemplary embodiment of the present invention, the third capacitor electrode is formed in parallel with the scanning line, and thus storage capacitors can be enlarged by using the non-aperture region.

(12) In a further exemplary embodiment of the first aspect of the present invention, in the electro-optical device, the capacitance of the second storage capacitor is smaller than that of each of the first storage capacitor and the third storage capacitor.

In this exemplary embodiment of the present invention, the second storage capacitor which includes the first capacitor electrode and the third capacitor electrode consisting of the same film as the scanning line is small, and thus capacitors can be formed without affecting error in the operation of the TFT.

(13) In a further exemplary embodiment of the first aspect of the present invention, the electro-optical device may further include a fourth storage capacitor which may include the fourth capacitor electrode consisting of the same film as the semiconductor layer, an insulating film facing the fourth capacitor electrode, and a fifth capacitor electrode arranged opposite to the fourth capacitor electrode with the insulating film provided therebetween, for shielding the semiconductor layer from light.

In this exemplary embodiment of the present invention, the fourth storage capacitor is formed by using the fourth capacitor electrode consisting of the same film as the semiconductor layer, which constitutes the third storage capacitor, and a light-shielding film for shielding the semiconductor layer from light, and storage capacitors can thus be laminated in the thickness direction of the substrate, thereby permitting the construction of a relatively large storage capacitor in the non-aperture region even when the pixel pitch is decreased. Also, the fifth capacitor electrode may include the light-shielding film, and thus storage capacitors can be constructed by a laminated structure which may include a relatively small number of layers. In addition, the light-shielding film is formed to cover the substrate side of at least the channel region, whereby the properties of the thin film transistors can be effectively prevented from being changed by incidence of the returned light from the substrate side on the channel region.

(14) In a further exemplary embodiment of the first aspect of the present invention, in the electro-optical device, the fifth capacitor electrode is electrically connected to the first capacitor electrode in the periphery of the image display region.

In this construction of the present invention, the first capacitor electrode, the fifth capacitor electrode and the third capacitor electrode can be formed with a common potential, thereby permitting the formation of stable storage capacitors.

(15) In a further exemplary embodiment of the first aspect of the present invention, the electro-optical device may further include a fifth storage capacitor which may include the first capacitor electrode, an insulating film laminated on the first capacitor electrode, and a sixth capacitor electrode arranged opposite to the first capacitor electrode with the insulating film provided therebetween to form the pixel electrode.

In this exemplary embodiment of the present invention, the fifth storage capacitor is formed by using the first capacitor electrode, which constitutes the first storage capacitor, and the pixel electrode, and storage capacitors can thus be laminated in the thickness direction of the substrate, thereby permitting the construction of a relatively large storage capacitor in the non-aperture region even when the pixel pitch is decreased. Also, the sixth capacitor electrode may include the pixel electrode, and thus storage capacitors can be constructed by a laminated structure consisting of a relatively small number of layers.

(16) In a further embodiment of the first aspect of the present invention, in the electro-optical device, the fifth storage capacitor is formed over the entire periphery of each pixel.

In this exemplary embodiment of the present invention, a storage capacitor can be formed by using the peripheral region of each pixel.

(17) In a second exemplary aspect of the present invention, an electro-optical device may include a scanning line formed above a substrate, a data line formed above the substrate, a thin film transistor connected to the data line, a pixel electrode connected to the drain region of the thin film transistor, a channel region of the thin film transistor on which the scanning line is arranged with a gage insulating film formed therebetween, and a light-shielding conductive film which constitutes a capacitor electrode of a storage capacitor and which is arranged above the scanning line to cover at least the channel region of the thin film transistor.

In this exemplary embodiment of the present invention, the gate insulating film, the scanning line, and the conductive film are laminated in this order on the channel region formed on the substrate. In this laminated structure, the channel region can be shielded by the light-shielding conductive film. Since the conductive film also functions as the capacitor electrode of the storage capacitor, the storage capacitor can be constructed while sufficiently shielding the channel region by a laminated structure that may include a relatively small number of layers.

(18) In another exemplary embodiment of the second aspect of the present invention, in the electro-optical device, the conductive film covers at least portions of the channel region of the thin film transistor, the junction region between a source region and the channel region of the thin film transistor, the junction region between the drain region and the channel region of the thin film transistor, and source and drain regions adjacent to the respective junction regions.

In this construction of the present invention, at least portions of the channel region, the junction regions between the source-drain regions and the channel region, and the source-drain regions adjacent to the junction regions are covered with the conductive film, and it is thus possible to shield even the lightly-doped region of the thin film transistor having, for example, a LDD structure, from incident light, thereby permitting a further decrease in changes in the properties of the thin film transistors.

(19) In still another embodiment of the second aspect of the present invention, in the electro-optical device, the storage capacitor may include a first conductive film which forms one of capacitor electrodes of the storage capacitor, and a second conductive film which forms the other capacitor electrode thereof, the second conductive film electrically connecting a semiconductor layer constituting the drain region to the pixel electrode.

In this exemplary embodiment of the present invention, the second conductive film which constitutes the other electrode of the storage capacitor also functions as a conductive film for relaying the drain region to the pixel electrode, and it is thus possible to prevent etching penetration during the formation of a contact hole for connecting the pixel electrode and the drain region. Namely, the drain region can be connected to the second conductive film through the contact hole formed on the drain region, and the pixel electrode can be connected to the second conductive film through the contact hole formed on the second conductive film to require the two types of contact holes, whereby the etching depth can easily be controlled because of the shortness of the contact holes to prevent the penetration.

(20) In a further exemplary embodiment of the second aspect of the present invention, in the electro-optical device, the second conductive film covers at least portions of the channel region of the thin film transistor, the junction region between a source region and the channel region of the thin film transistor, the junction region between the drain region and the channel region of the thin film transistor, and the source and drain regions adjacent to the respective junction regions.

In this exemplary embodiment of the present invention, the channel region is shielded from light by the scanning line arranged above the channel region, and the first conductive film, and further shielded by the second conductive film arranged between the scanning line and the first conductive film, and thus the channel region can be shielded by triple films to further increase the effect of shielding the channel region.

(21) In a further exemplary embodiment of the second aspect of the present invention, in the electro-optical device, the channel region is covered with the data line arranged above the first conductive film with an insulating film provided therebetween.

In this exemplary embodiment, since the channel region is shielded by the scanning line formed thereon, and the first conductive film, and further shielded by the second conductive film and the data line arranged thereon, light-shielding can be performed with quadruple films, thereby further increasing the effect of shielding the channel region. Furthermore, since the data line is arranged above the first conductive film, an increase in temperature due to light absorption by the first conductive firm can be suppressed.

(22) In a further exemplary embodiment of the second aspect of the present invention, the electro-optical device may further include a third conductive film which may consist of the same film as the scanning line, and which is arranged opposite to the second conductive film with an interlayer insulating film provided therebetween.

In this exemplary embodiment of the present invention, a storage capacitor can be formed by overlapping the first and second conductive films, and a storage capacitor can also be formed by arranging the second and third conductive films opposite to each other with the interlayer insulating film provided therebetween, thereby permitting lamination of storage capacitors in the thickness direction of the substrate. Therefore, even when the pixel pitch is decreased, a relatively large storage capacitor can be formed in the non-aperture region. Since the third conductive film consists of the same film as the scanning line, the storage capacitors can be formed by a laminated structure that may include a relatively small number of layers.

(23) In a further exemplary embodiment of the second aspect of the present invention, the electro-optical device may further include a fourth conductive film which may consist of the same film as the drain region, and which is arranged opposite to the third conductive film with the gate insulating film provided therebetween.

In this exemplary embodiment of the present invention, since the fourth conductive film may consist of the same film as the drain region is arranged opposite to the third conductive film with the gate insulating film provided therebetween, thereby permitting further lamination of a storage capacitor in the thickness direction of the substrate. Namely, the storage capacitor formed by overlapping the first and second conductive films, the storage capacitor formed by overlapping the second and third conductive films, and the storage capacitor formed by overlapping the third and fourth conductive films enable lamination of storage capacitors in the thickness direction of the substrate. Therefore, even when the pixel pitch is decreased, a relatively large storage capacitor can be formed in the non-aperture region. Since the fourth conductive film may consist of the same film as the drain region, the storage capacitors can be formed by a laminated structure that may include a relatively small number of layers.

(24) In a further exemplary embodiment of the second aspect of the present invention, in the electro-optical device, the first conductive film and the third conductive film are electrically connected to each other.

In this exemplary embodiment of the present invention, two storage capacitors can be formed with the second conductive film formed therebetween.

(25) In a further exemplary embodiment of the second aspect of the present invention, in the electro-optical device, the second conductive film and the fourth conductive film are electrically connected to each other.

In this exemplary embodiment of the present invention, two storage capacitors can be formed with the third conductive film formed therebetween.

(26) In a further exemplary embodiment of the second aspect of the present invention, in the electro-optical device, the first conductive film and the third conductive film are electrically connected to each other, and the second conductive film and the fourth conductive film are electrically connected to each other.

In this exemplary embodiment of the present invention, a storage capacitor is formed in a shape in which the first and the third conductive films, and the second and fourth conductive films, which are arranged in the thickness direction, are engaged in a comb form. Therefore, a larger storage capacitor can be constructed in the non-aperture region.

(27) In a further exemplary embodiment of the second aspect of the present invention, in the electro-optical device, the first conductive film covers the channel region, and the data line is formed on the channel region and the adjacent region thereof so as not to project from the first conductive film in a plan view.

In this exemplary embodiment of the present invention, since the first conductive film covers the channel region, even with oblique incident light, incidence on the channel region can be prevented. Furthermore, the data line is formed on the channel region so as not to project from the first conductive film in a plan view. Since the first conductive film is formed with a larger width and located nearer to the channel region, compared with the data line, incidence of oblique light on the channel region can be prevented, and incidence of reflected light from the data line on the channel region can also be prevented.

(28) In a further exemplary embodiment of the second aspect of the present invention, in the electro-optical device, the first conductive films may include films having lower reflectance than the data lines.

In this exemplary embodiment of the present invention, since the first conductive film has lower reflectance than that of the data line, when reflected light reaching the channel region due to oblique returned light, or multiple reflected light is reflected by the lower surface of the first conductive film, as in the present invention, incident light can be attenuated by an amount corresponding to a decrease in reflectance to suppress the influence of reflected light, as compared with a case in which light is reflected by the lower surface of the data line. Namely, in the present invention, even when reflected light or multiple reflected light from the lower surface of the first conductive film reaches the channel region, the light intensity is decreased, and thus a change in the properties of the thin film transistors due to the reflected light can be suppressed. The channel region can also be sufficiently shielded from oblique incident light by widening the first conductive film.

(29) In a further exemplary embodiment of the second aspect of the present invention, in the electro-optical device, each of the first conductive film and the data line may include a film containing at least Al.

In this exemplary embodiment of the present invention, incident light can be reflected by the data line and the first conductive film to prevent an increase in the temperature of the electro-optical device and decrease the resistance of the first conductive film.

(30) In a further exemplary embodiment of the second aspect of the present invention, the electro-optical device may further include an underlying light-shielding film which is arranged below the semiconductor layer on the substrate and which is formed to cover at least the channel region as viewed from the opposite side of the substrate, and not to project from the first conductive film in a plan view of the channel region and the adjacent region thereof.

In this exemplary embodiment of the present invention, since the scanning line, the first conductive film and the data line are formed above the channel region, the channel region can be prevented from being irradiated with light from above, and the upper and lower side of the channel region can be shielded because the underlying light-shielding film is further arranged below the channel region. Particularly, the underlying light-shielding film covers the channel region, and can thus prevent the channel region from being irradiated with light (returned light or the like) from the opposite side of the substrate. Furthermore, since the underlying light-shielding film is formed not to project from the first conductive film in a plan view of the channel region and the adjacent region thereof, the channel region can be prevented from being irradiated with incident light reflected by the underlying light-shielding film. In addition, even when there is oblique returned light which is likely to be incident on the channel region due to multiple reflection, the returned light is mostly reflected by the first conductive film having low reflectance and then incident on the channel region, and thus attenuated light is incident on the channel region, whereby the channel region can be prevented from being irradiated with light reflected by the data line having high reflectance. Therefore, even when multiple reflection occurs, the influence on the channel region can be significantly suppressed.

(31) In a further exemplary embodiment of the second aspect of the present invention, in the electro-optical device, at least either of the first conductive film and the underlying light-shielding film is made of a high-melting-point metal.

In this exemplary embodiment of the present invention, the first conductive film and the underlying light-shielding film are made of, for example, a single metal, an alloy, a metal silicide, or the like which contains at least one of opaque high-melting-point metals such as Ti (titanium), Cr (chromium), W (tungsten), Ta (tantalum), Mo (molybdenum), Pd (lead), and the like. Therefore, the first conductive film and the underlying light-shielding film can be prevented from being broken or melted by high-temperature treatment. For example, in the use of Al (aluminum) generally used as a material for the data line, the data line has a reflectance of over 80%, while the first conductive film made of a high-melting-point metal such as Ti, Cr, W, or the like, has reflectance significantly lower than the reflectance of the data line, whereby the effect of the present invention can be sufficiently exhibited.

(32) In a further exemplary embodiment of the second aspect of the present invention, in the electro-optical device, the first conductive film has substantially the same size as the second conductive film under the data line.

In this exemplary embodiment, since the first conductive film has substantially the same size as the second conductive film, light can be prevented from entering the channel layer due to internal reflection by the first conductive film, and the area of the first conductive film can be increased to enlarge storage capacitors.

(33) In a further exemplary embodiment of the second aspect of the present invention, in the electro-optical device, the first conductive film is extended from the image display region in which the pixel electrode is arranged to the periphery thereof, and connected to a constant potential source in the peripheral region.

In this exemplary embodiment, the first conductive film functions not only as the light-shielding film but also as an electrode of the storage capacitor, which functions as a capacitor line, and thus a storage capacitor which may include the capacitor electrode in which the capacitor line is connected to the constant potential source, can be formed in a laminated structure which may include a relatively small number of layers while sufficiently shielding the channel region. In this case, the capacitor electrode may include the first conductive film, or the capacitor electrode and the other capacitor line (lengthy capacitor line) may include a conductive film different from the first conductive film. In addition, the capacitor electrode can be connected to the constant potential source by effectively using the light-shielding region (the non-aperture region of each pixel). As the constant potential source, a constant potential source for peripheral circuits such as a data line driving circuit, a scanning line driving circuit, can be used, and an exclusive constant potential source need not be provided to exhibit good efficiency.

(34) In a further exemplary embodiment of the second aspect of the present invention, in the electro-optical device, the third conductive film may include the capacitor line which is extended from the image display region to the periphery thereof along the scanning line, and connected to the constant potential source in the peripheral region, the first conductive film being connected to the capacitor line.

In this exemplary embodiment, the first conductive film is connected to the capacitor line, and thus the potential of the first conductive film can be kept constant through the capacitor line to prevent the situation in which the properties of the thin film transistor are adversely affected by a change in the potential of the first conductive film, even when the first conductive film is arranged near the channel region. When the first conductive film is used as the capacitor line, the potential of the first conductive film can be fixed by the capacitor line, and thus the first conductive film satisfactorily functions as the capacitor electrode.

(35) In a further exemplary embodiment of the second aspect of the present invention, in the electro-optical device, the underlying light-shielding film may include a light-shielding conductive film, and is connected to the capacitor line for each pixel.

In this exemplary embodiment, the underlying light-shielding film is connected to the capacitor line for each pixel, and thus the potential of the underlying light-shielding film can be kept constant through the capacitor line to prevent the situation in which the properties of the thin film transistors are adversely affected by a change in the potential of the underlying light-shielding films, even when the underlying light-shielding film is arranged near the channel region. When the underlying light-shielding film is used as the capacitor electrode, the potential of the underlying light-shielding film can be fixed by the capacitor line, and thus the underlying light-shielding film satisfactorily functions as the capacitor electrode.

(36) In a third exemplary aspect of the present invention, an electro-optical device may include a thin film transistor, a data line electrically connected to a semiconductor layer of the thin film transistor through a first connection portion, a scanning line overlapped with the semiconductor layer of the thin film transistor, a pixel electrode electrically connected to the semiconductor layer of the thin film transistor through a second connection portion, and a light-shielding film arranged in a region including the data line and the scanning line except the first and second connection portions.

In this exemplary embodiment construction of the present invention, a region with a poor contrast ratio produced in the periphery of the pixel electrode can be shielded by the light-shielding film.

(37) In another exemplary embodiment of the third aspect of the present invention, in the electro-optical device, the light-shielding film overlaps with the edge of the pixel electrode.

In this exemplary embodiment of the present invention, the regions including the data line and the scanning line can be shielded by the light-shielding film to define the non-aperture region.

(38) In still another exemplary embodiment of the third aspect of the present invention, the electro-optical device may further include an underlying light-shielding film provided below the semiconductor layer so that at least a portion of the thin film transistor is held between the light-shielding film and the underlying light-shielding film.

In this exemplary embodiment of the present invention, light incidence on the thin film transistor can be prevented by the light-shielding film and the underlying light-shielding film to suppress a change in the properties of the thin film transistor.

(39) In a further exemplary embodiment of the third aspect of the present invention, in the electro-optical device, the underlying light-shielding film is extended along either of the data line and the scanning line.

In this exemplary embodiment of the present invention, the light-shielding performance of the non-pixel aperture regions can be increased only by the substrate having the thin film transistor.

(40) In a still further exemplary embodiment of the third aspect of the present invention, in the electro-optical device, an anti-reflection film is formed on at least the side of the underlying light-shielding film opposite to the thin film transistor side thereof.

In this exemplary embodiment of the present invention, when light is incident on the underlying light-shielding film, the anti-reflection film can prevent reflection of the light to the channel region and the region adjacent to the channel region of the thin film transistor.

(41) In a further exemplary embodiment of the third aspect of the present invention, the electro-optical device may further include a conductive relay film for electrically connecting the semiconductor layer and the pixel electrode.

In this exemplary embodiment of the present invention, etching penetration due to the formation of contact holes for connecting the pixel region and the drain region can be prevented.

(42) In a further exemplary embodiment of the third aspect of the present invention, in the electro-optical device, the relay film is arranged in a region including the data line and the scanning line except the first connection portion for connecting the semiconductor layer and the data line.

In this exemplary embodiment of the present invention, the light-shielding performance can be improved while securing the first connection portion for connecting the semiconductor layer and the data line.

(43) In a further exemplary embodiment of the third aspect of the present invention, in the electro-optical device, the relay film is arranged in the second connection portion between the semiconductor layer and the pixel electrode, which is avoided from the light-shielding film.

In this exemplary embodiment of the present invention, the second connection portion between the semiconductor layer and the pixel electrode, which cannot be shielded by the light-shielding film, can be shielded to completely shield the region along the scanning line.

(44) In a further exemplary embodiment of the third aspect of the present invention, in the electro-optical device, the data line is made of a light-shielding material.

In this exemplary embodiment of the present invention, the light-shielding performance can be further improved.

(45) In a further exemplary embodiment of the third aspect of the present invention, in the electro-optical device, a space is formed between the data line and the pixel electrode, and the light-shielding film is arranged in the space.

In this exemplary embodiment of the present invention, a parasitic capacitor between the data line and the pixel electrode can be decreased, and the space therebetween can be shielded by the light-shielding film to define the pixel aperture region.

(46) In a further exemplary embodiment of the third aspect of the present invention, in the electro-optical device, the data line is arranged in the first connection portion between the semiconductor layer and the data line, which is avoided from the light-shielding film.

In this exemplary embodiment of the present invention, the first connection portion between the semiconductor layer and the data line, which cannot be shielded by the light-shielding film, can be shielded to completely shield the region along the data line.

(47) In a further exemplary embodiment of the third aspect of the present invention, in the electro-optical device, the non-pixel aperture region may include the light-shielding film and the underlying light-shielding film.

In this exemplary embodiment of the present invention, the light-shielding performance of the thin film transistor can be improved by shortening the distance between the light-shielding film and the underlying light-shielding film.

(48) In a further exemplary embodiment of the third aspect of the present invention, in the electro-optical device, the scanning line is extended to substantially the center of the non-pixel aperture region.

In this exemplary embodiment of the present invention, if the capacitor electrode which constitutes the storage capacitor need not be made of the same film as the scanning line, the scanning line can be extended to substantially the center of the non-pixel aperture region to improve the light-shielding performance of the channel region of the thin film transistor and the adjacent region thereof.

(49) In a further exemplary embodiment of the third aspect of the present invention, in the electro-optical device, in the periphery of the thin film transistor including the channel region, the relay film is located in a region inward of the light-shielding film, and the underlying light-shielding film is located in a region inward of the relay film.

In this exemplary embodiment of the present invention, light incident from the light-shielding film side is not incident directly on the underlying light-shielding film so that incidence of light reflected by the underlying light-shielding film on the thin film transistor can be decreased.

(50) In a further exemplary embodiment of the third aspect of the present invention, in the electro-optical device, the semiconductor layer is located in a region inward of the data line.

In this exemplary embodiment of the present invention, the semiconductor layer is formed in a region inward of the data line, and thus incidence of light on the semiconductor layer can be decreased. Therefore, the semiconductor layer is not extended along the scanning line, whereby the pitch of the non-pixel aperture regions can be decreased, and the light-shielding performance can be improved.

DETAILED DESCRIPTION OF PREFERRED EMBODIMENTS

Exemplary embodiments of the present invention will be described below with reference to the drawings.

(First Exemplary Embodiment)

Figure 1:
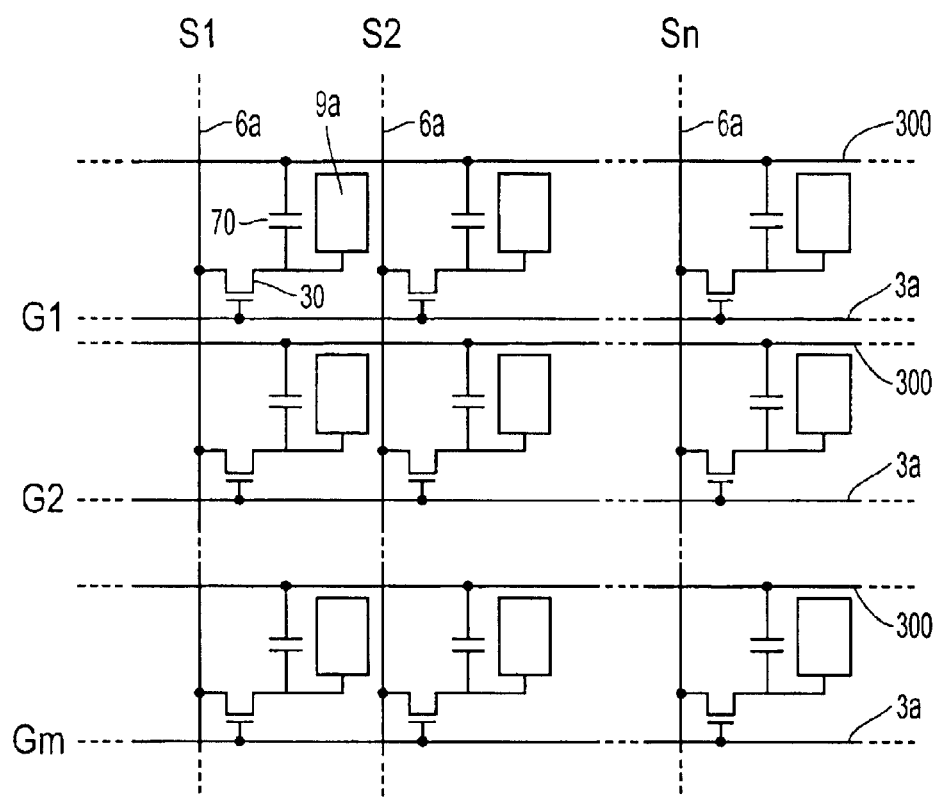
FIG. 1 is a drawing of equivalent circuits including various elements, wiring, etc. provided on a plurality of pixels which are arranged in a matrix and which constitute an image display region of an electro-optical device in accordance with a first exemplary embodiment of the present invention.
Figure 2:
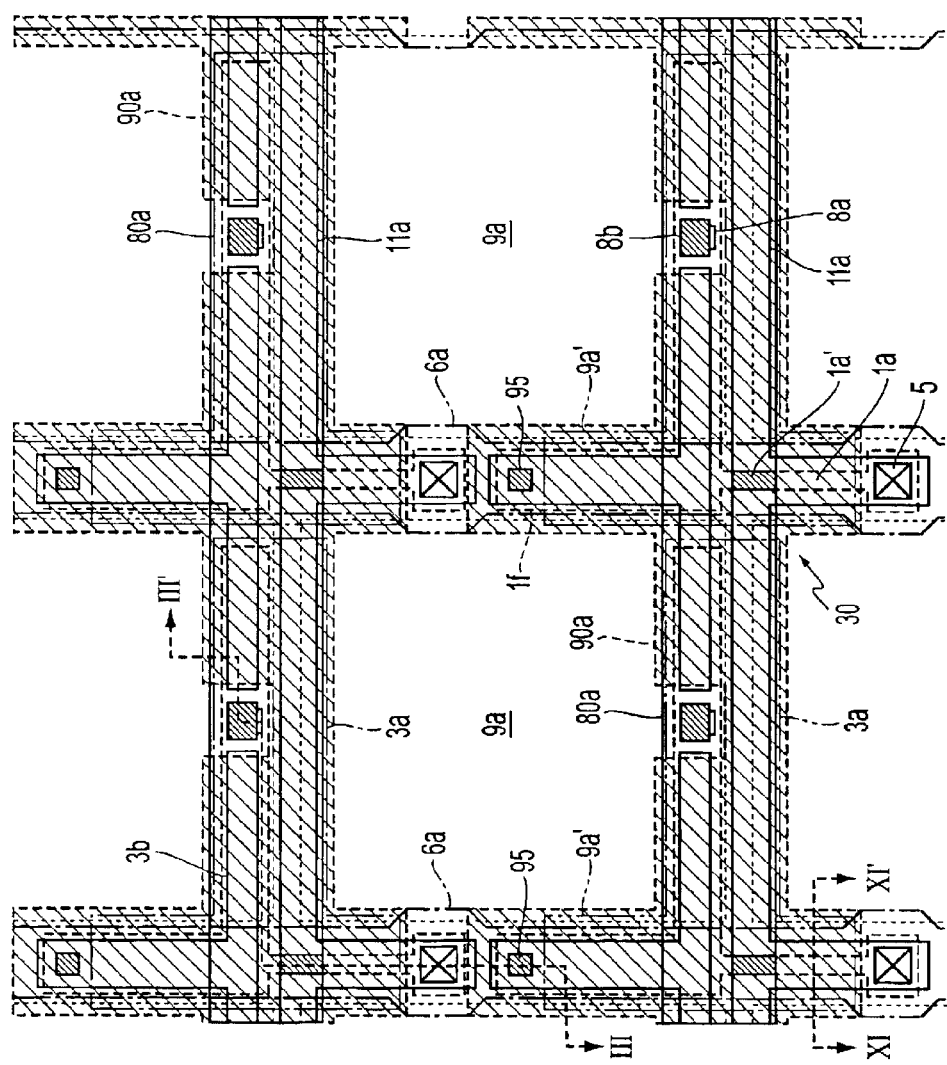
FIG. 2 is a plan view of a plurality of adjacent pixel groups of a TFT array substrate on which data lines, scanning lines, pixel electrodes, etc. are formed in the electro-optical device in accordance with the first embodiment.
Figure 3:
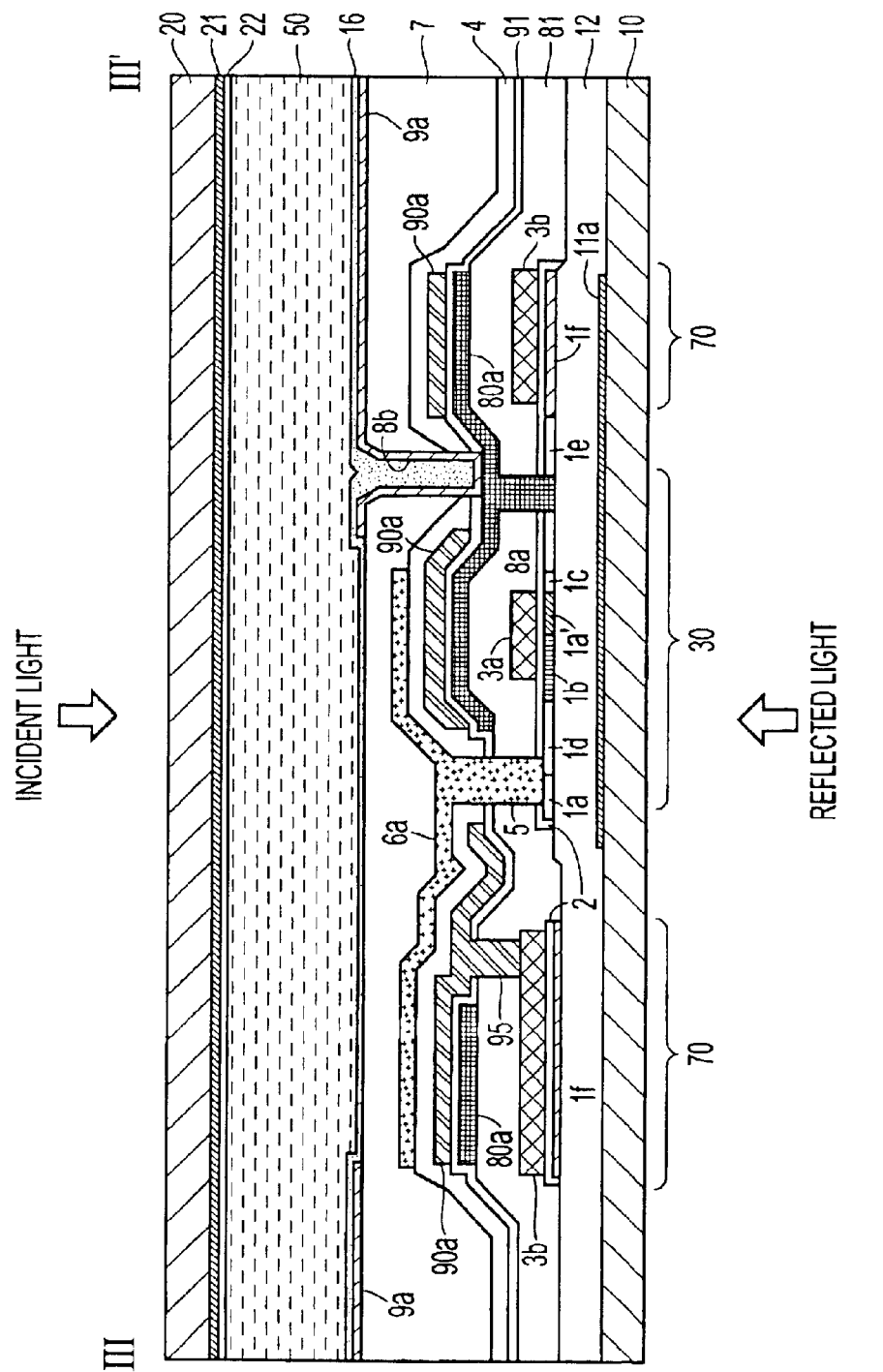
FIG. 3 is a sectional view taken along line III-III' in FIG. 2.

The construction of a liquid crystal device as an example of an electro-optical device of the present invention will be described with reference to FIGS. 1 to 11(B). FIG. 1 is a drawing showing equivalent circuits which include various elements, wiring, etc. of a plurality of pixels which constitute an image display region of the liquid crystal device and which are formed in a matrix, FIG. 2 is a plan view of a plurality of adjacent pixel groups of a TFT array substrate on which data lines, scanning lines, pixel electrodes, etc. are formed, and FIG. 3 is a sectional view taken along line III-III' in FIG. 2. In FIG. 3, layers and members are shown on different reduction scales in order to make each of the layers and the members recognizable in the drawing.

In FIG. 1, in a plurality of pixels which constitute the image display region of the liquid crystal device of this embodiment and which are formed in a matrix, pixel electrodes 9a and TFTs 30 for controlling the pixel electrodes 9a are formed, and data lines 6a to which image signals are supplied are electrically connected to the sources of the TFTs 30. Image signals S1, S2, ..., Sn to be written on the data lines 6a may be supplied in this order in line sequence, or supplied to each group of the adjacent data lines 6a. Furthermore, scanning lines 3a are electrically connected to the gates of the TFTs 30 so that scanning signals G1, G2, ... Gm are applied to the scanning lines 3a in this order in line sequence with predetermined timing. The pixel electrodes 9a are electrically connected to the drains of the TFTs 30 so that the TFTs 30 respectively serving as switching elements are switched off for a predetermined time to write the image signals S1, S2, ..., Sn supplied from the data lines 6a with predetermined timing. The image signals S1, S2, ..., Sn at the predetermined level written into a liquid crystal through the pixel electrodes 9a are maintained between the pixel electrodes 9a and a counter electrode (described below) formed on a counter substrate (described below) for the predetermined time. The liquid crystal modulates light due to a change in the molecular orientation and order according to the level of the applied voltage to enable gray scale display. In a normally white mode, the quantity of transmitted light of incident light increases according to the applied voltage, while in a normally black mode, the quantity of transmitted light of incident light increases according to the applied voltage to emit light from the liquid crystal device as a whole with a contrast ratio corresponding to the image signals. In order to prevent a leakage of the maintained image signals, storage capacitors 70 are added in parallel to the liquid crystal capacitor formed between the pixel electrodes 9a and the counter electrode. Each of the storage capacitors 70 is formed between one of capacitor electrodes electrically connected to each of the pixel electrodes 9a and the other capacitor electrode electrically connected to a corresponding capacitor line 300 to which a constant potential is supplied, through a dielectric film. For example, each of the storage capacitors 70 functions to maintain the voltage of the corresponding pixel electrode 9a for a time three orders of magnitude longer than the time of application of a source voltage. This can further improve the holding property to realize a bright crystal device with a high contrast ratio.

In FIG. 2, a plurality of the transparent pixel electrodes 9a (the pixel electrode ends 9a' shown by dotted lines) are provided in a matrix on the TFT array substrate of the liquid crystal device, and the data lines 6a and the scanning lines 3a are provided along the longitudinal and lateral boundaries between the pixel electrodes 9a. The scanning lines 3a are arranged opposite to the channel regions 1a' (the regions shown by slanted lines in the drawing) of semiconductor layers 1a, and function as gate electrodes. In this embodiment, TFT 30 is provided at each of the intersections of the scanning lines 3a and the data lines 6a, in which each of the scanning lines 3a is partially opposed as the gate electrode to the corresponding channel region 1a'. Each of the pixel electrodes 9a is electrically connected to the drain of the corresponding semiconductor layer 1a, which will be described below, by relaying a relay film 80a serving as an intermediate conductive film through contact holes 8a and 8b. The data lines 6a are electrically connected to the source regions of the semiconductor layers 1a consisting of a polysilicon film or the like, which will be described below, through contact holes 5.

Also, capacitor electrodes 3b (third capacitor electrodes) consisting of the same film as the scanning lines 3a may be provided so as to overlap with at least portions of capacitor electrodes 1f (fourth capacitor electrodes), which are extended from the semiconductor layers 1a, through gate insulating films described below. This permits the formation of at least portions of the storage capacitors 70 shown in FIG. 1.

In each of the regions shown by bold lines in FIG. 2, an underlying light-shielding film 11a is provided along the corresponding scanning line 3a so as to pass through the portion below the TFTs 30. More specifically, the underlying light-shielding films 11a are provided to cover at least the TFT channel regions 1a' and the junction regions between the channel regions 1a' and the source and drain regions, as viewed from the TFT array substrate side. Also, the underlying light-shielding films 11a are preferably extended along the direction of the scanning lines 3a to the periphery of the image display region in which the pixel electrodes 9a are formed in a matrix to be connected to a constant potential source in the periphery region. In this way, by fixing the potential of the underlying light-shielding films 11a to the constant potential, operational errors of the TFTs 30 can be prevented. As the constant potential source, a constant potential source such as a negative power source, a positive power source supplied to peripheral circuits for driving the liquid crystal device, for example, a scanning line driving circuit, a data line driving circuit, which will be described below, a ground power source, a constant potential source supplied to the counter electrode, or the like can be used. The potential level is preferably the off level of scanning signals supplied to the scanning lines 3a. As a result, substantially no parasitic capacitance occurs between the underlying light-shielding films 11a and the scanning lines 3a, thereby causing substantially no delay in the scanning signals supplied to the scanning lines 3a.

Particularly, in this embodiment, a light-shielding conductive film (first capacitor electrode) 90a is formed in each of the regions shown by slanted lines in FIG. 2. The light-shielding conductive films 90a are formed between the scanning lines 3a and the data lines 6a so that in a plan view, the light-shielding conductive films 90a can be overlapped with the regions where wiring such as the data lines 6a and the scanning lines 3a, the TFTs 30 and the storage capacitors are formed, except the regions of the contact holes 5 and the contact holes 8b, thereby permitting the realization of light shielding on the TFT array substrate. Also, the light-shielding conductive films 90a can be extended to the periphery of the image display region along the scanning lines 3a to be connected to a constant potential source in the peripheral region. As a result, the light-shielding conductive films 90a can function as the capacitor lines 300 shown in FIG. 1. Also, the light-shielding conductive films 90a can be connected to the capacitor electrodes 3b consisting of the same film as the scanning lines 3a through contact holes 95 so that the storage capacitors 70 can easily be formed between the capacitor electrodes 3b and the capacitor electrodes 1f by supplying a constant potential. As a constant potential source, the constant potential source such as the negative power source, the positive power source supplied to the peripheral circuits for driving the liquid crystal device, for example, the scanning line driving circuit, the data line driving circuit, which will be described below, the ground power source, the constant potential source supplied to the counter electrode, or the like can be used.

As shown in a sectional view of FIG. 3, the liquid crystal device of this embodiment may include a transparent TFT array substrate 10 which constitutes an example of substrates, and a transparent counter substrate 20 arranged to opposite to the TFT array substrate 10. For example, the TFT array substrate 10 may include a quartz substrate, a glass substrate, or a silicon substrate, and the counter substrate 20 may include a glass substrate or a quartz substrate. The TFT array substrate 10 may include the pixel electrodes 9a provided thereon and including a transparent conductive film such as an ITO film. In the use of a TN (Twisted Nematic) liquid crystal or the like for a liquid crystal layer 50, an alignment film 16 subjected to predetermined orientation by rubbing or the like is provided on the surfaces of the pixel electrodes 9a.

On the other hand, a counter electrode 21 consisting of a transparent conductive film such as a ITO film is provided over the entire surface of the counter substrate 20, and an alignment film 22 subjected to predetermined orientation by rubbing or the like is provided on the surface of the counter electrode 21.

Furthermore, the underlying light-shielding films 11a are respectively provided at positions opposite to the TFTs 30 between the TFT array substrate 10 and the TFTs 30. The underlying light-shielding films 11a are formed opposite to at least the channel regions 1a' of the switching TFTs 30, and the junction regions between the channel regions 1a' and the source and drain regions, whereby preventing irradiation of the channel regions 1a' and the adjacent regions thereof with reflected light from the TFT array substrate 10 side. Therefore, the properties of the TFTs 30 are not changed by the occurrence of a leakage current due to light. The underlying light-shielding conductive films 11a are preferably made of a single metal, an alloy, a metal silicide, or the like, which contains at least one of opaque high-melting-point metals such as Ti (titanium), Cr (chromium), W (tungsten), Ta (tantalum), Mo (molybdenum), Pb (lead). Alternatively, anti-reflection films of polysilicon or the like may be formed on the surfaces of the underlying light-shielding films 11a in order to absorb light even when incident light directly enters the TFTs 30. With weak reflected light from the TFT array substrate 10 side, a polysilicon film may be used for the underlying light-shielding films 11a. By forming the underlying light-shielding films 11a using such a material, for example, the underlying light-shielding films 11a can be prevented from being broken or melted by high-temperature treatment for forming gate insulating films 2. Although, in this embodiment, the underlying light-shielding films 11a are formed in strips along the scanning lines 3a below the scanning lines 3a, of course, the underlying light-shielding films 11a may be formed in strips along the data lines 6a below the data lines 6a, or formed in a lattice form below the scanning lines 3a and the data lines 6a. By forming the underlying light-shielding films 11a in strips, relief of stress due to the underlying light-shielding films 11a can be realized, while by forming then in a lattice form, the high-shielding performance can be improved and the resistance of the underlying light-shielding films 11a can be further decreased.

Furthermore, an underlying insulating film 12 is provided between the underlying light-shielding films 11a and the TFTs 30. The underlying insulating film 12 is provided for electrically insulating the semiconductor layers 1a which constitute the TFTs 30 from the underlying light-shielding films 11a. Furthermore, the underlying insulating film 12 is formed over the entire surface of the TFT array substrate 10 to have the function as an underlying film for the TFTs 30. Namely, the underlying insulating film 12 has the function of preventing roughening of the surface of the TFT array substrate 10 during polishing, and a change in the properties of the TFTs 30 due to stains remaining after cleaning. The underlying insulating film 12 may consist of, for example, a highly insulating glass film of NSG (nondoped silicate glass), PSG (phosphosilicate glass), BSG (boron silicate glass), BPSG (boron phosphosilicate glass), or the like, a silicon oxide film, a silicon nitride film. The underlying insulating film 12 can also prevent the situation that the TFTs 30 are contaminated by the underlying light-shielding films 11a.

In this embodiment, furthermore, each of the TFTs 30 formed on the underlying insulating film 12 has an LDD (Lightly Doped Drain) structure in which the semiconductor which layer 1a may consist of, for example, a polysilicon film, may consist of a lightly-doped source region 1b and a lightly-doped drain region 1c with the channel region 1a' in which a channel is formed by an electric field supplied from the corresponding scanning line 3a, heavily-doped source and drain regions 1d and 1e being connected to the lightly-doped source and drain regions 1b and 1c, respectively. In this way, by forming the LDD structure TFTs 30, a leakage current of the TFTs 30 in an off state can be significantly decreased to improve the holding performance. Each of the TFTs 30 may have an offset structure in which the lightly-doped source region 1b and the lightly-doped drain region 1c are not doped with impurities, or a self alignment TFT structure in which a heavily-doped of impurity is implanted by using the gate electrode which may include a part of the corresponding scanning line 3a as a mask to form the heavily-doped source region 1d and the heavily-doped drain region 1e in a self alignment manner.

The gate insulation thin films 2 of 100 nm or less are formed on the semiconductor layers 1a. The gate insulating films 2 can be formed by oxidizing a polysilicon film at a high temperature of 1000° C. or more to form a film having high density and insulation. When high-temperature treatment cannot be carried out, the gate insulating films 2 may be formed by CVD (Chemical Vapor Deposition), or the like. The scanning lines 3a consisting of a low-resistance polysilicon film in which, for example, P (phosphorus) is implanted, are arranged on the gate insulating films 2 so that the portions of the scanning lines 3a overlapped with the semiconductor layers 1a function as the gate electrodes.

Furthermore, an interlayer insulating film 81 is deposited on the gate insulating films 2 and the scanning lines 3a formed on the semiconductor layers 1a by CVD or the like, and the contact holes 8a are formed in the gate insulating films 2 and the interlayer insulating film 81 at the predetermined positions of the heavily-doped drain regions 1e. The heavily-doped drain regions 1e are electrically connected to the conductive relay films 80a through the contact holes 8a. Furthermore, interlayer insulating films 91, 4 and 7 are laminated in turn on the relay films 80a, and the contact holes 8b are formed in these interlayer insulating films at positions of the relay films 80a (second capacitor electrodes). The relay films 80a are electrically connected to the pixel electrodes 9a through the contact holes 8b. Therefore, the relay films 80a function as intermediate conductive films for electrically connecting the semiconductor layers 1a and the pixel electrodes 9a. By forming the relay films 80a, long contact holes need not be formed from the pixel electrodes 9a to the semiconductor layers 1a, and thus penetration in the thin semiconductor layers 1a having a thickness of, for example, about 50 nm, can be prevented. The formation of the separate contact holes has the advantage that the diameter of either of the contact holes 8a and 8b can be decreased. Therefore, the regions of the contact holes 8a and 8b can be decreased to increase the pixel aperture ratio and realize high definition. Like the underlying light-shielding films 11a, the relay films 80a are formed by using a material such as a single metal, an alloy, a metal silicide, which contains at least one of opaque high-melting-point metals such as Ti, Cr, W, Ta, Mo, Pb, thereby permitting the relay films 80a to function as light-shielding films. Furthermore, even when the relay films 80a are formed to a thickness of about 50 nm, no penetration in the relay films 80a occurs during the formation of the contact holes 8b because of a high etching selection ratio. When the interlayer insulating film 81 for insulating the scanning lines 3a from the relay films 80a is formed to a thickness of, for example, 500 nm or more, which has no influence on the switching operation of the TFTs 30, the relay films 80a can be provided to overlap with the TFTs 30 and the scanning lines 3a in a plan view. Therefore, light shielding can be realized below the data lines 6a near the semiconductor layers 1a which constitute the TFTs 30, thereby preventing the channel regions 1a' and the lightly-doped source regions 1b and the lightly-doped drain regions 1c, which serve as the junction regions, from being irradiated directly with incident light and stray light reflected by the data lines 6a and the like. As a result, a leakage current of the TFTs 30 in an off state can be significantly decreased to further increase the holding performance.

In this embodiment, as shown in FIG. 3, light-shielding conductive films 90a are formed on the relay films 80a with the interlayer insulating film 91 provided therebetween. As described above, the light-shielding conductive films 90a can shield the non-aperture regions except the contact holes 5 and 8b. Since the light-shielding conductive films 90a can also function as the capacitor lines 300 shown in FIG. 1, at least portions of the storage capacitors 70 can be formed by using the interlayer insulating film 91 as a dielectric film between the conductive films 90a and the relay films 80a. Namely, the relay films 80a and the light-shielding conductive films 90a function as electrodes for forming the storage capacitors 70. Light shielding can also be realized near the semiconductor layers 1a, which constitute the TFTs 30, by two layers including the relay films 80a and the light-shielding conductive films 90a. Therefore, a leakage current of the TFTs 30 in an off state can be further decreased to cause an advantage for a liquid crystal device such as a projection projector used under a strong light source. Like the underlying light-shielding films 11a or the relay films 80a, the light-shielding conductive films 90a are formed by using a material such as such as a single metal, an alloy, a metal silicide, which contains at least one of opaque high-melting-point metals such as Ti, Cr, W, Ta, Mo, Pb, thereby permitting the realization of wiring having high light shielding performance and low resistance. When performing high-temperature treatment at 400° C. or more, for example, activation heat treatment is terminated before the light-shielding conductive films 90a are formed, the light-shielding conductive films 90a can be formed by using a single metal, an alloy, a metal silicide, or the like containing low-resistance Al (aluminum). By forming the light-shielding conductive films 90a serving as the capacitor lines 300 using Al which is the same material as the data lines 6a, the resistance of the capacitor lines 300 can be made smaller than a conventional polysilicon film by two or three orders of magnitude. As a result, the crosstalk in the direction of the scanning lines 3a, which is due to the high time constant of the capacitor lines 300, can be significantly decreased.

The light-shielding conductive films 90a may be electrically connected to the capacitor electrodes 3b consisting of the same film as the scanning lines 3a through the contact holes 95 for the respective pixel electrodes 9a. As a result, the capacitor electrodes 3b can be fixed at the same constant potential as the light-shielding conductive films 90a. Therefore, at least portions of the storage capacitors 70 can be formed between the capacitor electrodes 3b and the relay films 80a electrically connected to the heavily-doped drain regions 1e of the semiconductor layers 1a by using the interlayer insulating film 81 as a dielectric film. Furthermore, at least portions of the storage capacitors 70 can also be formed between the capacitor electrodes 3b and the capacitor electrodes 1f extended from the heavily-doped drain regions 1e of the semiconductor layers 1a by using the gate insulating films 2 as dielectric films. The contact holes 95 are formed below the data lines 6a so that the semiconductor layers 1a connected to the pixel electrodes 9a adjacent along the data lines 6a are preferably electrically connected to the data lines 6a near the contact holes 5. By using this construction, large regions for forming the storage capacitors 70 can be secured below the data lines 6a.

Figure 4:
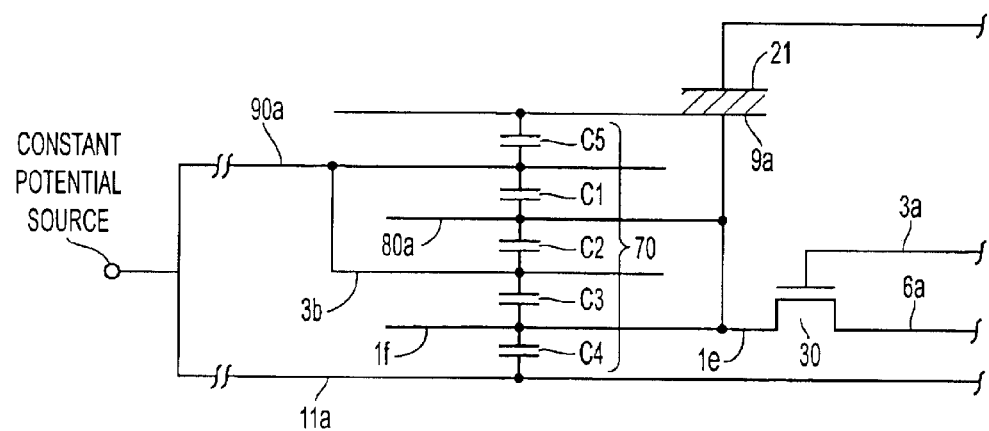
FIG. 4 is a drawing of an equivalent circuit of each of pixels which constitute an electro-optical device in accordance with an exemplary embodiment of the present invention.

FIG. 4 is a drawing showing an equivalent circuit of each of the pixels which constitute the liquid crystal device of this embodiment. As shown in FIG. 4, the heavily-doped drain region 1e of the semiconductor layer 1a is electrically connected to the relay film 80a and the pixel electrode 9a, while the light-shielding conductive film 90a is electrically connected to the capacitor electrode 3b. The light-shielding conductive film 90a is extended from the image display region to the periphery thereof to be connected to the constant potential source in the peripheral region. The underlying light-shielding film 11a may be electrically connected to the light-shielding conductive film 90a. These conductive films are combined to form the storage capacitors 70 having an ideal stacked structure. Namely, in this embodiment, the capacitor electrode 1f, the relay film 80a and the pixel electrode 9a can be formed between the respective conductive film layers of the light-shielding conductive film 90a fixed at the constant potential, the capacitor electrode 3b and the underlying light-shielding film 11a through dielectric films.

Specifically, in a plane view of the adjacent pixel groups in FIG. 2, the regions where the storage capacitors are formed are shown in FIGS. 5 to 9. In FIGS. 2 and 5 to 9, the reduction scales are the same.

Figure 5:
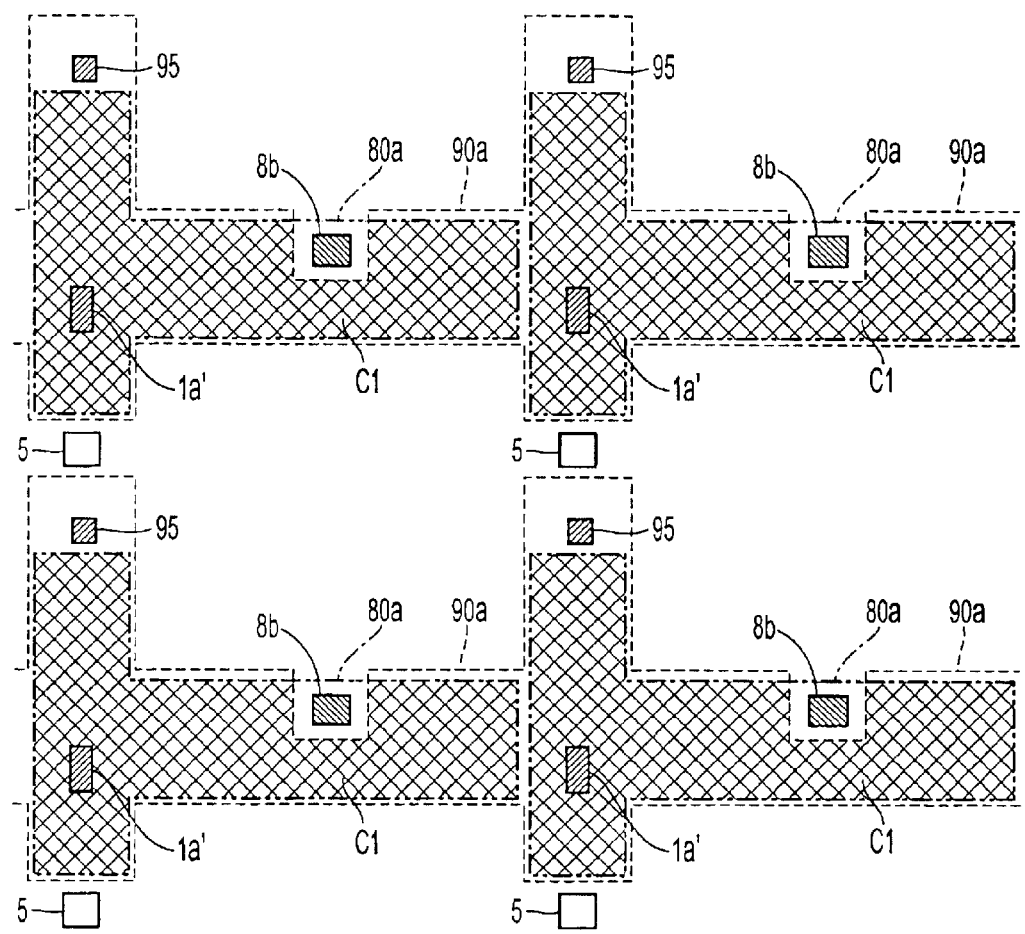
FIG. 5 is a plan view showing the light-shielding conductive films, and the relay films shown in FIG. 2.

FIG. 5 shows first storage capacitors C1 formed at positions between the layer of the scanning lines 3a and the layer of the data lines 6a, and between the light-shielding conductive films 90a and the relay films 80a. The interlayer insulating film 91 is used as a dielectric film. The cross-hatched regions are actual regions where the first storage capacitors C1 are actually formed, and the first storage capacitors C1 can be for formed in the significant portions of the non-aperture regions except the contact holes 5, 95 and 8b. When the capacitor electrodes 3b are not provided, the contact holes 95 for electrically connecting the capacitor electrodes 3b to the light-shielding conductive films 90a need not be formed, thereby permitting the formation of the first storage capacitors C1 in the regions of the contact holes 95. In this embodiment, the first storage capacitors C1 can be formed above the channel regions 1a' of the TFTs 30, which is impossible in a conventional device, thereby causing an advantage for improving the pixel aperture ratio and definition of a transmissive liquid crystal device. The interlayer insulating film 91 can be formed by using a film having high insulation and high dielectric constant, such as an oxide film, a nitride film. Where the relay films 80a consist of a polysilicon film, and the light-shielding conductive films 90a consist of a multilayer structure including a polysilicon film as a lower layer, and a light-shielding film containing a high-melting-point metal as an upper layer, the interlayer insulating film 91 can be formed by a continuous step using a polysilicon film, thereby permitting the formation of an insulating film having high density and less defect. Therefore, the defects of the device are decreased, and the interlayer insulating film 91a having a thickness of 100 nm or less can be formed to further enlarge the first storage capacitors C1.

Figure 6:
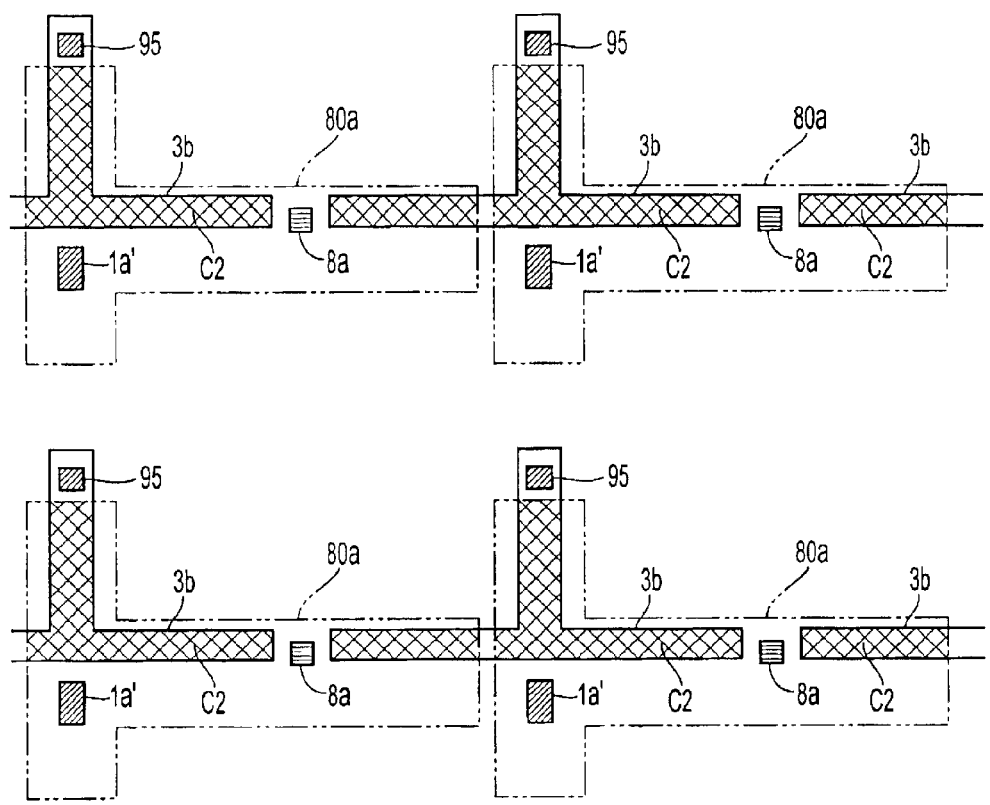
FIG. 6 is a plan view showing the relay films and the capacitor electrodes shown in FIG. 2.

FIG. 6 shows second storage capacitors C2 formed between the relay films 80a and the capacitor electrodes 3b. The interlayer insulating film 81 is used as a dielectric film. The crosshatched regions are regions where the second storage capacitors C2 are actually formed. The capacitor electrodes 3b are parted in the regions of the contact holes 8a for electrically connecting the semiconductor layers 1a and the relay films 80a in the respective pixels, and are electrically connected to the upper light-shielding conductive films 90a through the contact holes 95. As shown in FIG. 6, the capacitor electrodes 3b are formed in a T shape so that the second storage capacitors C2 can be efficiently formed. As the interlayer insulating film 81, a film having high insulation and a high dielectric constant, such as an oxide film, a nitride film can be formed. However, since the capacitor electrodes 3b consist of the same film as the scanning lines 3a, the regions where the second storage capacitors C2 can be formed become smaller than the regions where the first storage capacitors C1 are formed, as shown in FIG. 5. In addition, when the channel regions 1a' and the adjacent regions thereof are shielded from light by the relay films 80a, the thickness of the interlayer insulating film 81 must be 500 nm or more in order to prevent an operation error of the TFTs 30, and thus the second storage capacitors C2 cannot be so much enlarged as the fist storage capacitors C1 can be enlarged.

Figure 7:
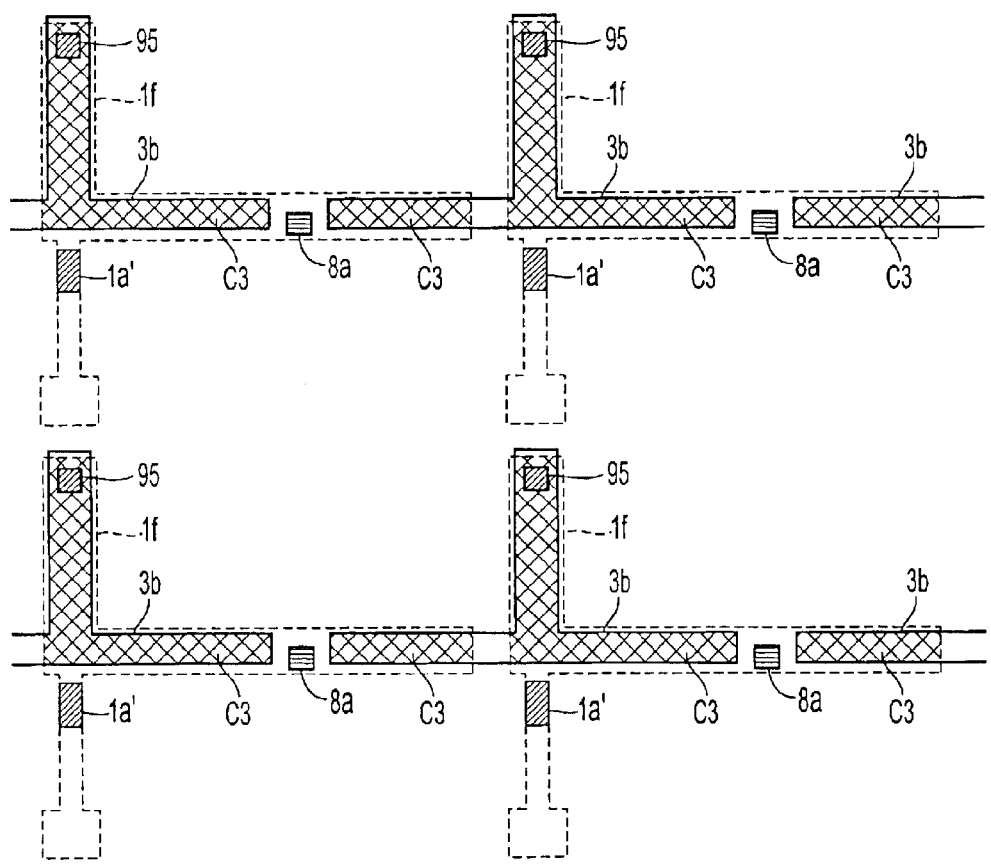
FIG. 7 is a plan view showing the capacitor electrodes and the semiconductor layers shown in FIG. 2.

FIG. 7 shows third storage capacitors C3 formed between the capacitor electrodes 3b and the capacitor electrodes 1f. The gate insulating films 2 are used as dielectric films. The crosshatched regions are regions where the third storage capacitors C3 are actually formed. Since the gate insulating films 2 are formed by oxidation at a high temperature of 1000° C. or more, as described above, a film having high density and insulation can be obtained. Therefore, the regions where the third storage capacitors C3 can be formed are substantially the same as the regions where the second storage capacitors C2 shown in FIG. 6 are formed, but the regions of the third storage capacitors C3 can be made larger than the regions of the second storage capacitors C2. The third storage capacitors C3 can also be formed below the regions of the contact holes 95 for electrically connecting the capacitor electrodes 3b and the upper light-shielding conductive films 90a.

Figure 8:
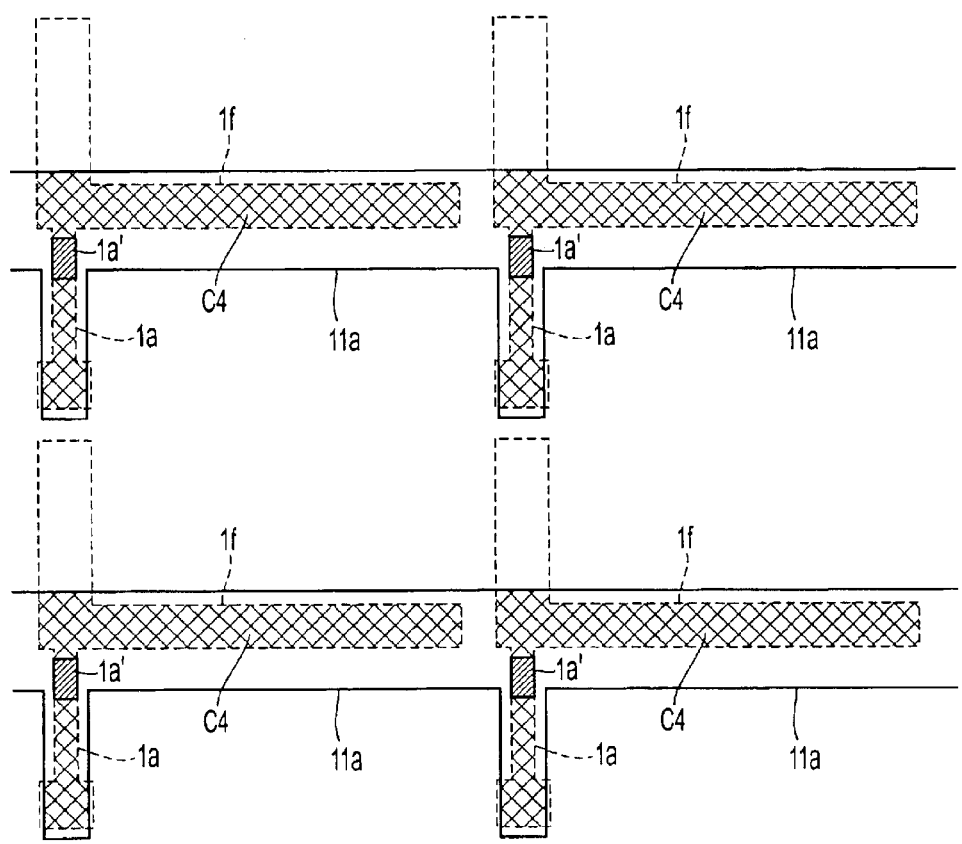
FIG. 8 is a plan view showing the semiconductor layers and the underlying light-shielding films shown in FIG. 2.

Furthermore, as shown in FIG. 8, fourth storage capacitors C4 can be formed between the capacitor electrodes 1f and the underlying light-shielding films 11a. The underlying insulating film 12 is used as a dielectric film. The crosshatched regions are regions where the fourth storage capacitors C4 are actually formed. When the underlying insulating film 12 is formed to a thickness of 500 nm or less, the distance between the channel regions 1a' and the underlying light-shielding films 11a is decreased to cause an operation error of the TFTs 30 according to the potential of the underlying light-shielding films 11a. Therefore, the underlying insulating film 12 may be selectively partially thinned in the regions where the capacitor electrodes 1f overlap with the underlying light-shielding films 11a in a plan view to enlarge the fourth storage capacitors C4. Namely, the portions of the underlying insulating film 12 other than the portions opposite to the channel regions 1a' can be thinned to enlarge the fourth storage capacitors C4.

Figure 9:
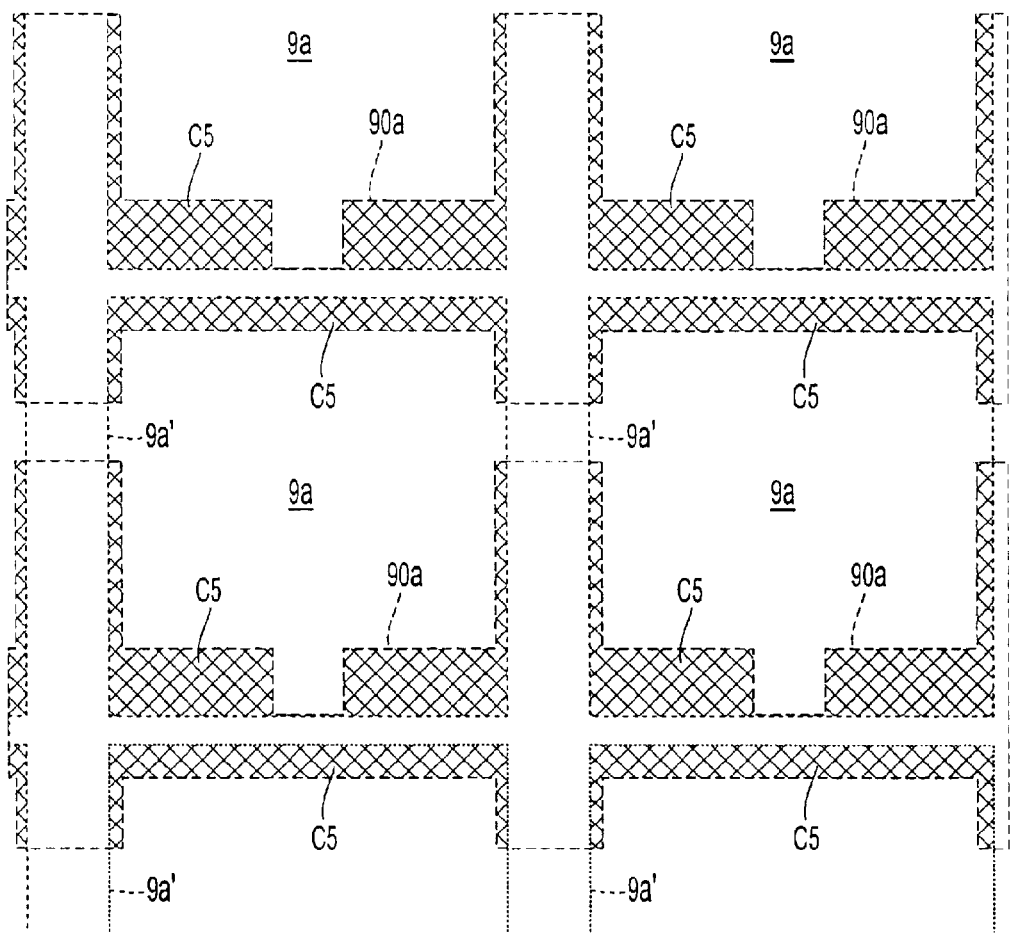
FIG. 9 is a plan view showing the light-shielding conductive films and the pixel electrodes shown in FIG. 2.

Furthermore, as shown in FIG. 9, fifth storage capacitors C5 can be formed between the pixel electrodes 9a and the light-shielding conductive films 90a. The interlayer insulating films 4 and 7 are used as dielectric films. The crosshatched regions are regions where the fifth storage capacitors C5 are actually formed. Each of the interlayer insulating films 4 and 7 consists of a highly insulating glass film of, for example, NSG, PSG, BSG, BPSG, a silicon oxide film, a silicon nitride film, or the like. However, since the data lines 6a are formed on the interlayer insulating film 4, the interlayer insulating film 7 must be thickly formed because a display image deteriorates due to the parasitic capacitor produced between the pixel electrodes 9a and the data lines 6a, and thus the fifth storage capacitors C5 cannot be so much enlarged as the first storage capacitors C1 can be enlarged.

In this way, in the liquid crystal device of this embodiment, by laminating the capacitor electrodes for forming the storage capacitors 70 through the dielectric films, the stacked type storage capacitors 70 each consisting of the five layers including the first storage capacitor C1 to the fifth storage capacitor C5 can be formed. As a result, even with the regions, where the storage capacitors are formed, are narrow, the great storage capacitors 70 can be effectively formed. In the liquid crystal device of this embodiment, at least the first storage capacitors C1 maybe formed. Even when, for example, the storage capacitor electrodes 3b cannot be formed because the aperture ratio and definition of the pixels are further increased, the structure of this embodiment permits the formation of the sufficient storage capacitors 70 by thinning the interlayer insulating film 91 as the dielectric film of the storage capacitors C1. Therefore, in this embodiment, any desired storage capacitor can be advantageously selected from the first storage capacitors C1 to the fifth storage capacitors C5 and used according to the specifications for the purpose of an electro-optical device.

Again refer to FIG. 3, the data lines 6a are formed on the interlayer insulating film 4 formed above the light-shielding conductive films 90a. The data lines 6a are also electrically connected to the heavily-doped source regions 1d of the semiconductor layers 1a through the contact holes 5 which are formed at the predetermined positions of the gate insulating films 2, the interlayer insulating film 81, the interlayer insulating film 91, and the interlayer insulating film 4. The data lines 6a consist of an Al metal film or metal silicide, or the like having low resistance and high light-shielding property because image signals are supplied thereto.

Figure 10:
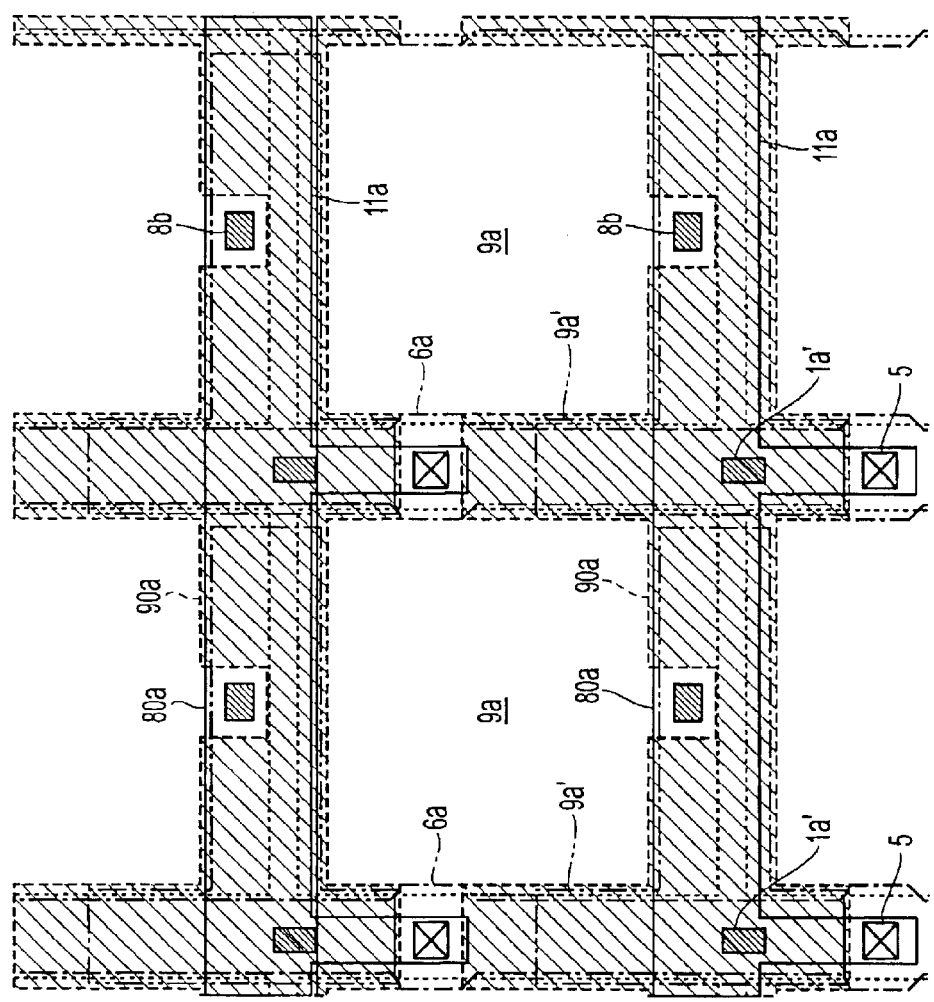
FIG. 10 is a plan view showing the underlying light-shielding films, the light-shielding conductive films, the relay films and the data lines shown in FIG. 2.

In the liquid crystal device of this embodiment, the light-shielding regions as the non-aperture regions can be defined by the data lines 6a and the light-shielding conductive films 90a. More specifically, as shown in FIG. 10, the light-shielding conductive films 90a are formed to overlap with the pixel electrodes 9a so as to shield the most of the regions including the channel regions 1a'. Also, the most of the regions along the data lines 6a can be shielded by the light-shielding conductive films 90a, and unlike in a conventional display device, thus the light-shielding regions need not be defined only by the data lines 6a. Therefore, the data lines 6a and the pixel electrodes 9a can be formed so as not to overlap with each other as much as possible through the interlayer insulating film 7. Therefore, the parasitic capacitors between the data lines 6a and the pixel electrodes 9a can be significantly decreased, thereby preventing the occurrence of deterioration in display image quality due to a change in potential of the pixel electrodes 9a. However, since the light-shielding conductive films 90a are formed below the data lines 6a, the regions where the contact holes 5 are formed for electrically connecting the data lines 6a and the semiconductor layers 1a cannot be shielded. Therefore, in the regions where the contact holes 5 are formed, the wide data lines 6a may be formed so as to partially overlap with the pixel electrodes 9a. When the regions where the contact holes 5 are formed is near the channel regions 1a', the vicinities of the channel regions 1a' cannot be sufficiently shielded by the light-shielding conductive films 90a. In this case, the regions where the contact holes 5 are formed may be moved along the data lines 6a in the direction away from the channel regions 1a' without any problem. This embodiment has the advantage that even when the regions where the contact holes 5 are formed are moved, the first storage capacitors C1 formed between the relay films 80a and the light-shielding conductive films 90a are not changed. The light-shielding conductive films 90a cannot be provided in the regions where the contact holes 8b are formed for electrically connecting the relay films 80a and the pixel electrodes 9a, and thus these regions may be shielded by the relay films 80a. If the relay films 80a consist of a light-transmissive film such as a polysilicon film, the regions may be shielded by the underlying light-shielding films 11a. In this case, the regions where the contact holes 8b are formed are preferably separated from the channel regions 1a'. As shown in FIG. 10, it is advantageous to form the contact holes 8b between the adjacent data lines 6a so that incident light does not reach the channel regions 1a' even when light is incident on the underlying light-shielding films 11a. Since the pixels can be formed in line symmetry with respect to the data lines 6a, for example, a projector including a combination of liquid crystal devices including TN liquid crystals having different twisting directions causes no deterioration in display image quality such as color irregularity.

In this way, in this embodiment, the light-shielding regions can be defined on the TFT array substrate 10, and thus light-shielding films need not be provided on the counter substrate 20, as shown in FIG. 3. Therefore, in mechanically combining the TFT array substrate 10 and the counter substrate 20, even when alignment is shifted, the regions (aperture regions) where light is transmitted are not changed because no light-shielding film is provided on the counter substrate 20. Therefore, a stable aperture ratio can be obtained to significantly decrease defects in the device.

Figure 11A:
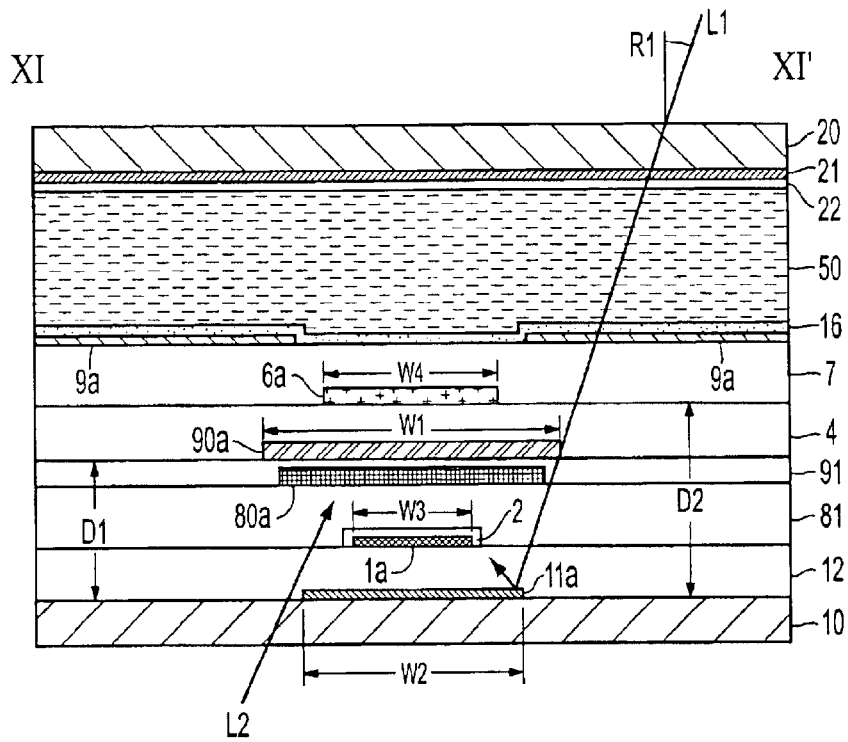
FIG. 11(A) is a sectional view taken along line XI-XI' in FIG. 11(B) is a sectional view of a related structure.
Figure 11B:
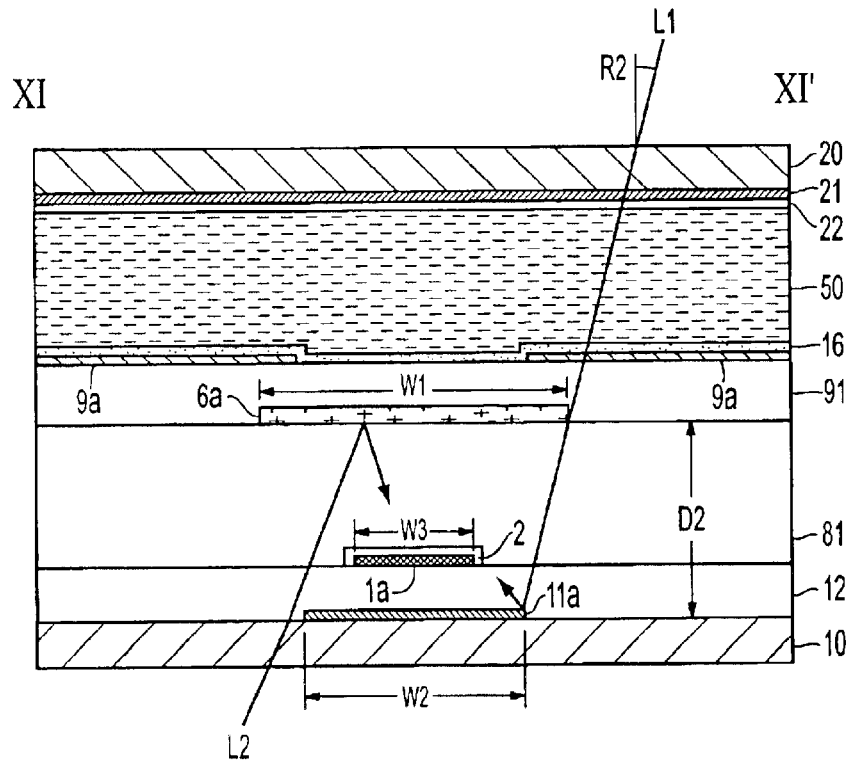

The liquid crystal device of this embodiment can also use a structure stronger against an angle of incident light than a conventional device. This will be described with reference to FIGS. 11(A)–(B). FIG. 11(A) is a sectional view taken along line XI-XI' in FIG. 2, and FIG. 11(B) shows a conventional structure. FIGS. 11(A) and (B) show the structures on same reduction scale.

In general, when light is incident on the vicinities of the channel regions 1a' of the semiconductor layers 1a, in an off state of the TFTs 30, the ability to hold the charges written on the pixel electrodes 9a are decreased by the occurrence of leakage currents due to photo excitation. Therefore, this embodiment uses a structure in which the light-shielding conductive films 90a are provided against incident light L1, and the underlying light-shielding films 11a are provided against reflected light L2 so as to prevent light irradiation of the semiconductor layers 1a, as shown in FIG. 11(A). Since the quality of reflected light L2 is one hundredth of the quality of incident light L1, in the channel regions and the vicinities thereof, the width W1 of each of the light-shielding conductive films 90a for shielding incident light L1 is larger than the width W2 of each of the underlying light-shielding films 11a. Namely, in the channel regions and the vicinities thereof, the underlying light-shielding films 11a are formed so as not to project from the light-shielding conductive films 90a. Furthermore, in the channel regions and the vicinities thereof, the width W3 of each of the semiconductor layers 1a is smaller than the width W2 of each of the underlying light-shielding films 11a. Namely, the channel regions and the vicinities thereof are covered with the underlying light-shielding films 11a, as viewed from the TFT array substrate side. By using this structure, even when incident light L1 is incident at an angle, the probability that the incident light reaches the semiconductor layers 1a can be decreased. In this embodiment, since the light-shielding conductive films 90a can be formed between the data lines 6a and the semiconductor layers 1a, light shielding can be achieved nearer to the channel regions than the conventional example shown in FIG. 11(B) in which the channel regions are shielded by the data lines 6a. In this embodiment and the conventional example, consideration is given to a margin for the incidence angle of the incident light L1. Since the semiconductor layers 1a has a width W3 of, for example, as small as 1 μm, the incident light L1 is not likely to be incident directly on the semiconductor layers 1a. Therefore, it is assumed that light incident on the underlying light-shielding films 11a provided below the semiconductor layers 1a is reflected and incident on the semiconductor layers 1a. It is also assumed that the underlying light-shielding films 11a of this embodiment shown in FIG. 11(A) and the conventional example shown in FIG. 11(1B) have the same width W2. It is further assumed that the width W1 of each of the light-shielding films 90a for shielding the incident light L1 in this embodiment is the same as the width W1 of each of the data lines 6a in the conventional example. In this embodiment, the interlayer distance between the underlying light-shielding films 11a and the light-shielding conductive films 90a is D1, while in the conventional example, the interlayer distance between the underlying light-shielding films 11a and the data lines 6a is D2. Summing that the interlayer distance between the underlying light-shielding films 11a and the data lines 6a in this embodiment is D2, the relation D1>≦D2 is obtained. Therefore, when the incident light L1 is incident at the same angle, the margin for the angle of the incident light L1 in this embodiment is larger than that in the conventional example by an amount corresponding to a decrease in the interlayer distance to the underlying light-shielding films 11a. Namely, assuming that the margin angle of the incident light L1 in this embodiment is R1, and the margin angle of the incident light L1 in the conventional example is R2, the relation R1>R2 is obtained. As a result, the margin for the incidence angle of the incident light in the liquid crystal device of this embodiment is larger than the conventional example, and thus the liquid crystal device of this embodiment can advantageously comply with an increase in the incidence angle with miniaturization of an optical system. In this embodiment, light-shielding films can also be formed on the sides of the semiconductor layers 1a through insulating films to further improve correspondence to the incidence angle.

In the liquid crystal device of this embodiment, unlike in the conventional example, light shielding need not be attained by the data lines 6a, and thus the width W4 of each of the data lines 6a in the channel region and the vicinities thereof can be made smaller than the width W1 of each of the light-shielding conductive films 90a. Namely, the relation W>W4 is obtained, and the data lines 6a are thus formed so as not to project from the light-shielding conductive films 90a in the channel region and the vicinities thereof. Therefore, it is possible to prevent the semiconductor layers 1a from being irradiated with stray light reflected by the data lines 6a. Particularly, since the light-shielding conductive films 90a can be formed by using a film containing a high-melting-point metal having lower reflectance than Al which forms the data lines 6a, stray light due to the data lines 6a can also be absorbed by the light-shielding conductive films 90a.

Furthermore, in the liquid crystal device of this embodiment, the relay films 80a can be formed below the light-shielding conductive films 90a, the vicinities of the semiconductor layers 1a can be shielded by the relay films 80a to improve the light-shielding performance. In this case, when the width of each of the relay films 80a is substantially the same as the width W1 of each of the light-shielding conductive films 90a, the light-shielding performance can be further improved. If the reflected light L2 is incident from the TFT array substrate 10 side, in this embodiment, light is absorbed by the relay films 80a consisting of polysilicon films or low-resistance films containing a high-melting-point metal, while in the conventional example, stray light reflected below the data lines 6a is likely to be incident on the semiconductor layers 1a because the data lines 6a having high reflectance are also used as light-shielding films. As a result, stray light due to internal reflection can be significantly decreased, thereby eliminating the need to take account of deterioration in the display image quality due to a leakage of the TFTs 30. By forming the relay films 80a consisting of films with low reflectance, like the data lines 6a, the light-shielding conductive films 90a may include a film containing at least Al having high reflectance. Therefore, in the light-shielding regions of the liquid crystal device, it is possible to form the data lines 6a and the light-shielding conductive films 90a consisting of films containing at least Al having high reflectance of, for example, 80% or more in the visible region, and thus reflect incident light by the data lines 6a and the light-shielding conductive films 90a to prevent an increase in temperature of the liquid crystal device. In the liquid crystal device of this embodiment, for example, it is thus possible to decrease the cost required for developing a cooling device of a projector, and improve the light-shielding performance of the liquid crystal device.

In the above-described embodiment, the surface of the interlayer insulating film 7 provided below the pixel electrodes 9a is planarized. This is performed for preventing disclination of the liquid crystal due to steps formed in wiring, elements, etc., and the lower interlayer insulating film 4 may be also planarized. In this embodiment, planarization can be performed by coating an organic or inorganic SOG (Silicon On glass) film by a spin coater, or CMP process.

(Second Exemplary Embodiment)

The construction of an electro-optical device in accordance with a second embodiment of the present invention will be described below with reference to FIGS. 12 to 16.

Figure 12:
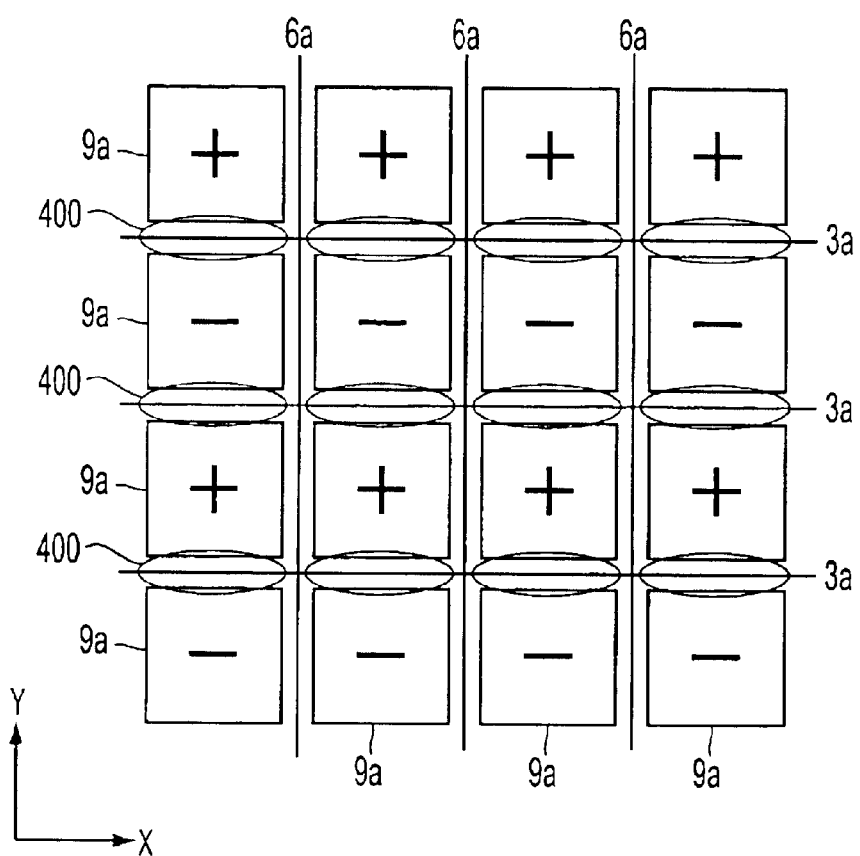
FIG. 12 is a schematic drawing showing the polarities of image signals supplied to a plurality of pixel electrodes which are arranged in a matrix and which constitute an image display region of an electro-optical device in accordance with a second exemplary embodiment of the present invention.

In a liquid crystal device as an example of electro-optical devices, AC reverse driving must be generally performed for preventing deterioration in a liquid crystal. Although several driving methods have been proposed, the liquid crystal of the second embodiment of the present invention uses a mechanism in which the polarities of image signals applied to the liquid crystal are reversed for each scanning line 3a, and the polarities of the image signals are further reversed for 1 field, as shown in FIG. 12. As a result, a DC component applied to the liquid crystal can be suppressed as much as possible, and the occurrence of flicker can be significantly decreased. When the polarities of image signals applied to the liquid crystal are reversed for each scanning line 3a, the image signals having the same polarity are written in the pixel electrodes 9a adjacent in the X direction along the scanning lines 3a, thereby producing no electric field between the adjacent pixel electrodes 9a. On the other hand, the image signals having different polarities are written in the pixel electrodes 9a adjacent in the Y direction along the data lines 6a, thereby producing an electric field between the adjacent pixel electrodes 9a to cause disclination 400 in the liquid crystal.

Figure 13:
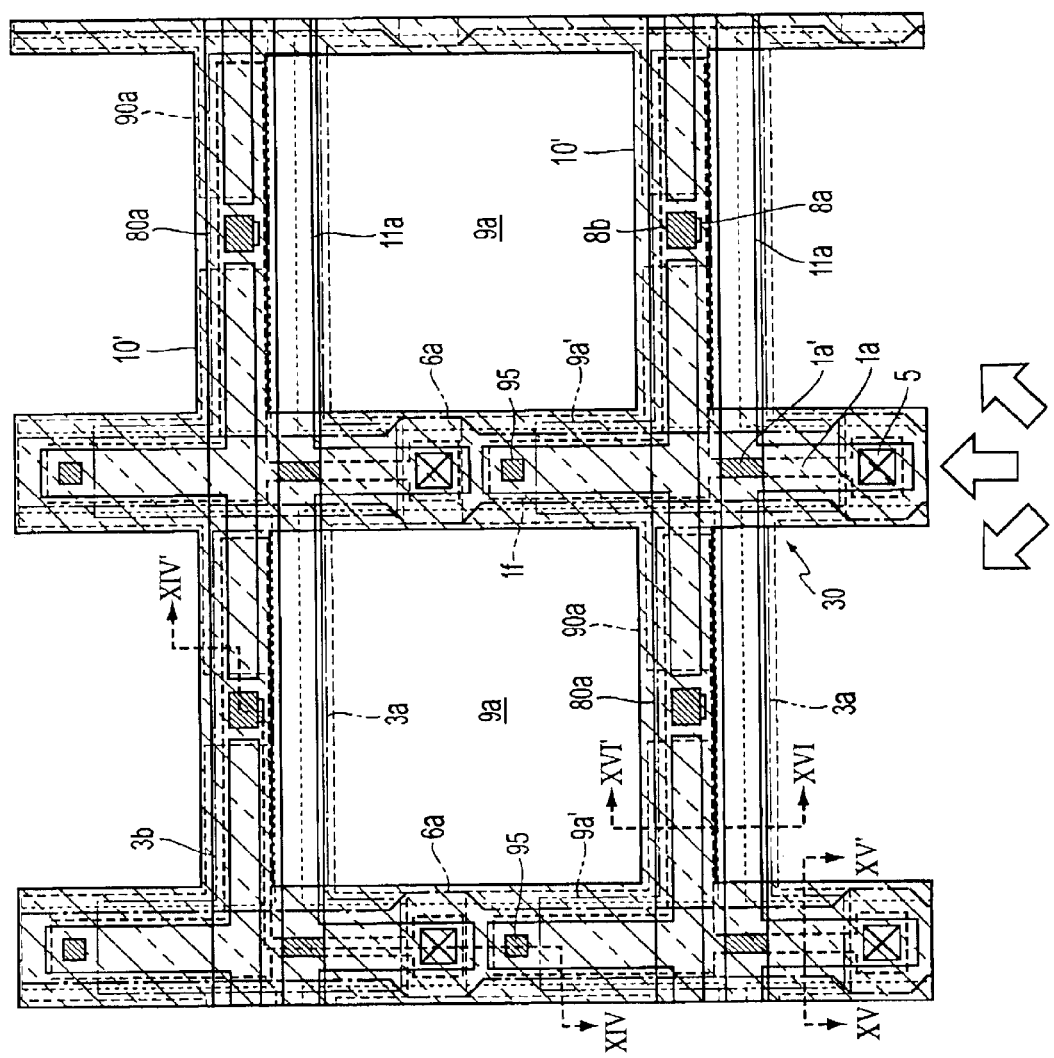
FIG. 13 is a plan view of a plurality of adjacent pixel groups of a TFT array substrate on which data lines, scanning lines, pixel electrodes, etc. are formed in the electro-optical device in accordance with the second embodiment.

Therefore, in order to minimize the regions where the disclination 400 occurs, as shown in FIG. 12, in the second embodiment of the present invention, grooves 10' are formed in the shadowed regions of a plurality of pixel groups on the TFT array substrate shown in FIG. 13 so that wiring such as the data lines 6a and the like, and TFTs 30 are partially buried in the grooves to planarize the substrate. In addition, when the TFT array substrate is rubbed in the direction shown by arrows in FIG. 13, the grooves 10' are not provided in the regions of the scanning lines 3a, which is in contact with the aperture regions, to further decrease the regions where the disclination 400 occurs. As a result, the regions of the pixels where light leaks, can be decreased, and the pixel aperture ratio can be significantly increased. Particularly, this embodiment is suitable for a liquid crystal device for a projector required to have brightness and a small size.

Figure 14:
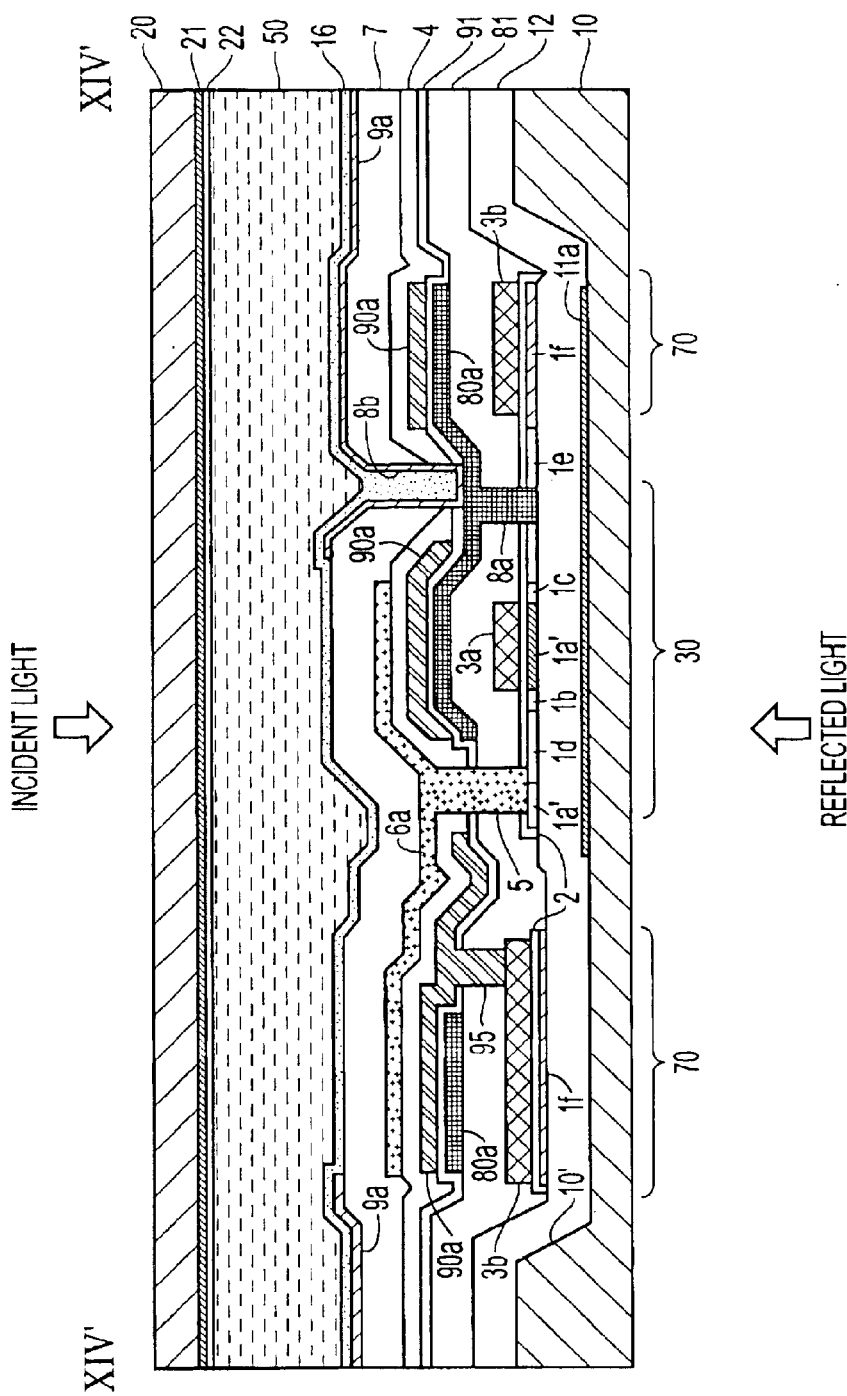
FIG. 14 is a sectional view taken along line XIV-XIV' in FIG. 13.

FIG. 14 is a sectional view taken along line XIV-XIV' in FIG. 13. As shown in FIG. 14, the grooves 10' are formed in the regions of the TFT array substrate 10 where the TFTs 30 and the storage capacitors 70 are formed so that the pixel electrodes 9a and the alignment film 16 can be substantially flatly formed. The grooves 10' can easily be formed by usual photolithography and etching. The taper angle of the sides of the grooves 10' can be controlled to various angles by a dry etching method or a wet etching method. In planarization by forming the grooves 10', control of the depth of the grooves 10' is important, but the depth can easily be controlled by controlling the dry etching time or the like. In such planarization by forming the grooves 10', planarization can be realized without using a photosensitive organic film or the like, and thus this method is particularly useful for a liquid crystal device of a projector using a strong light source.

Figure 15:
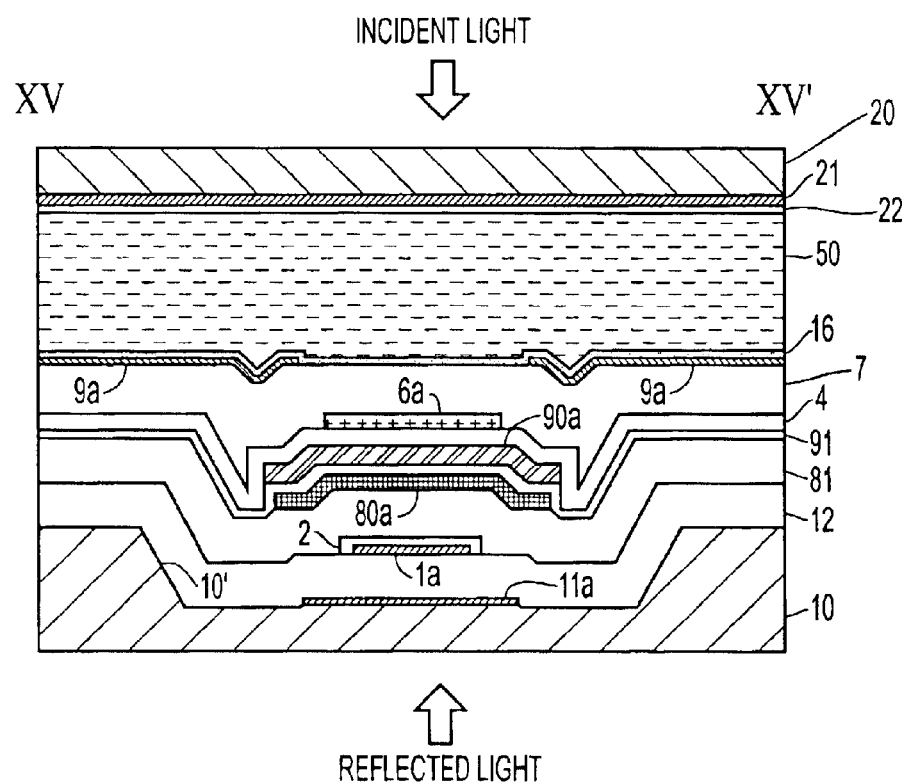
FIG. 15 is a sectional view taken along line XV-XV' in FIG. 13.

FIG. 15 is a sectional view taken along line XV-XV' in FIG. 13, showing the sectional structure between the pixel electrodes 9a adjacent in the X direction shown in FIG. 12. In this way, the grooves 10' are formed in the TFT array substrate 10 to permit substantially complete planarization of the regions where the data lines 6a are formed. Particularly, in rubbing along the data lines 6a, as shown in FIG. 13, no disclination occurs due to the steps formed by wiring such as the data lines 6a, and elements because the regions where the data lines 6a, etc. are formed are buried in the grooves and planarized.

Figure 16:
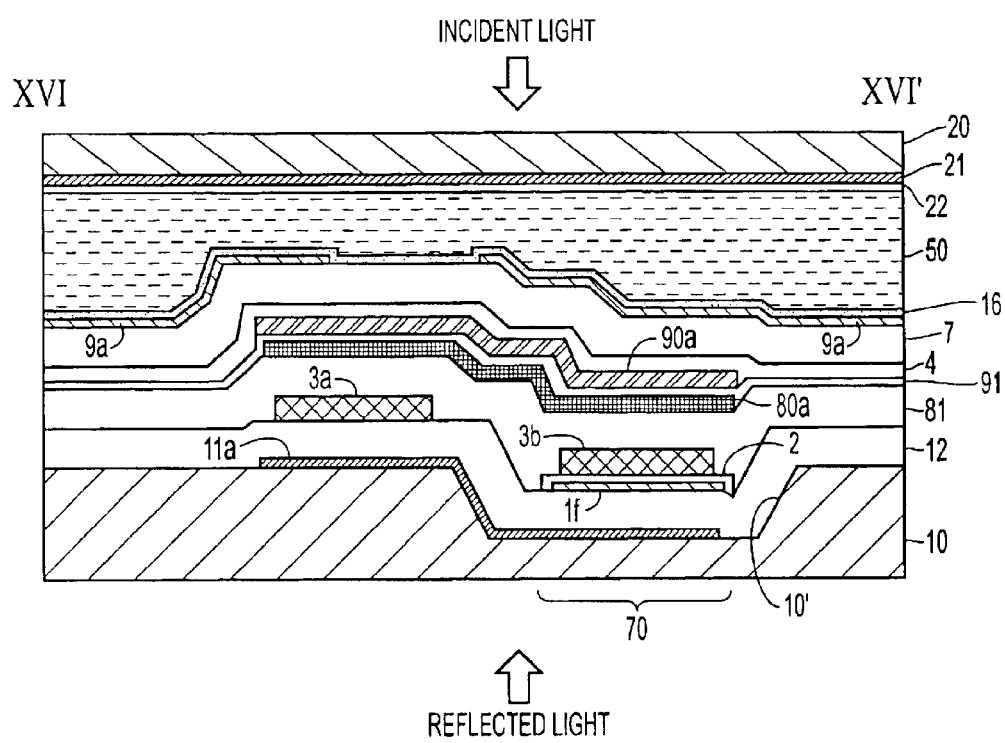
FIG. 16 is a sectional view taken along line XVI-XVI' in FIG. 13.

FIG. 16 is a sectional view taken along line XVI-XVI' in FIG. 13, showing the sectional structure between the pixel electrodes 9a adjacent in the Y direction shown in FIG. 12. Since disclination occurs in the liquid crystal due to an electric field between the adjacent pixel electrodes 9a, the grooves 10' are not formed in the regions of the TFT array substrate 10 where the scanning lines 3a are formed, so as to decrease the cell gap of the liquid crystal layer 50 in the partition regions between the adjacent pixel electrodes 9a, as shown in FIG. 16. Therefore, the electric field between the counter electrode 21 provided on the counter substrate 20 and the pixel electrodes 9a is increased, and thus the regions where disclination occurs in the liquid crystal can be decreased as much as possible even when an electric field occurs between the adjacent pixel electrodes 9a. Since the disclination need not be decreased by narrowing the cell gap of the liquid crystal, the problem of development of a liquid crystal for a narrow cell gap, the problem of causing difficulties in controlling the cell gap, etc. do not occur.

In this way, in the second embodiment of the present invention, the grooves 10' are formed in the TFT array substrate 10 so that wiring and elements can be completely or partially buried therein, thereby realizing an electro-optical device having a higher pixel aperture ratio, as compared with a case such as the CMP process which can perform only complete planarization. When the grooves 10' are formed not only in the TFT array substrate 10 but also in the interlayer insulating film such as the underlying insulating film 12 or the interlayer insulating film 81, the same effect can be obtained. Of course, the grooves 10' provided in the TFT array substrate 10 may be combined with the grooves provided in the interlayer insulating film such as the underlying insulating film 12 or the interlayer insulating film 81 for planarization.

(Third Exemplary Embodiment)

Figure 17:
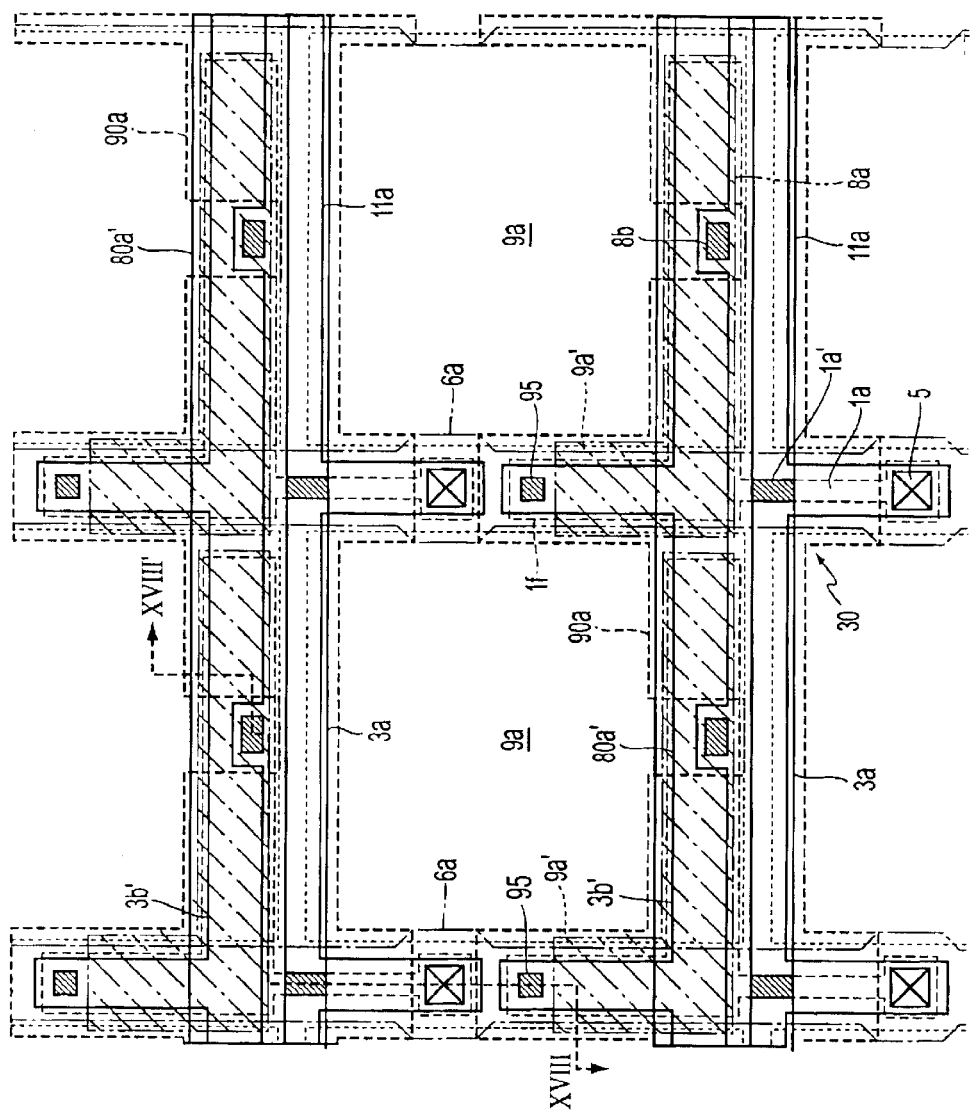
FIG. 17 is a plan view of a plurality of adjacent pixel groups of a TFT array substrate on which data lines, scanning lines, pixel electrodes, etc. are formed in the electro-optical device in accordance with a third exemplary embodiment.
Figure 18:
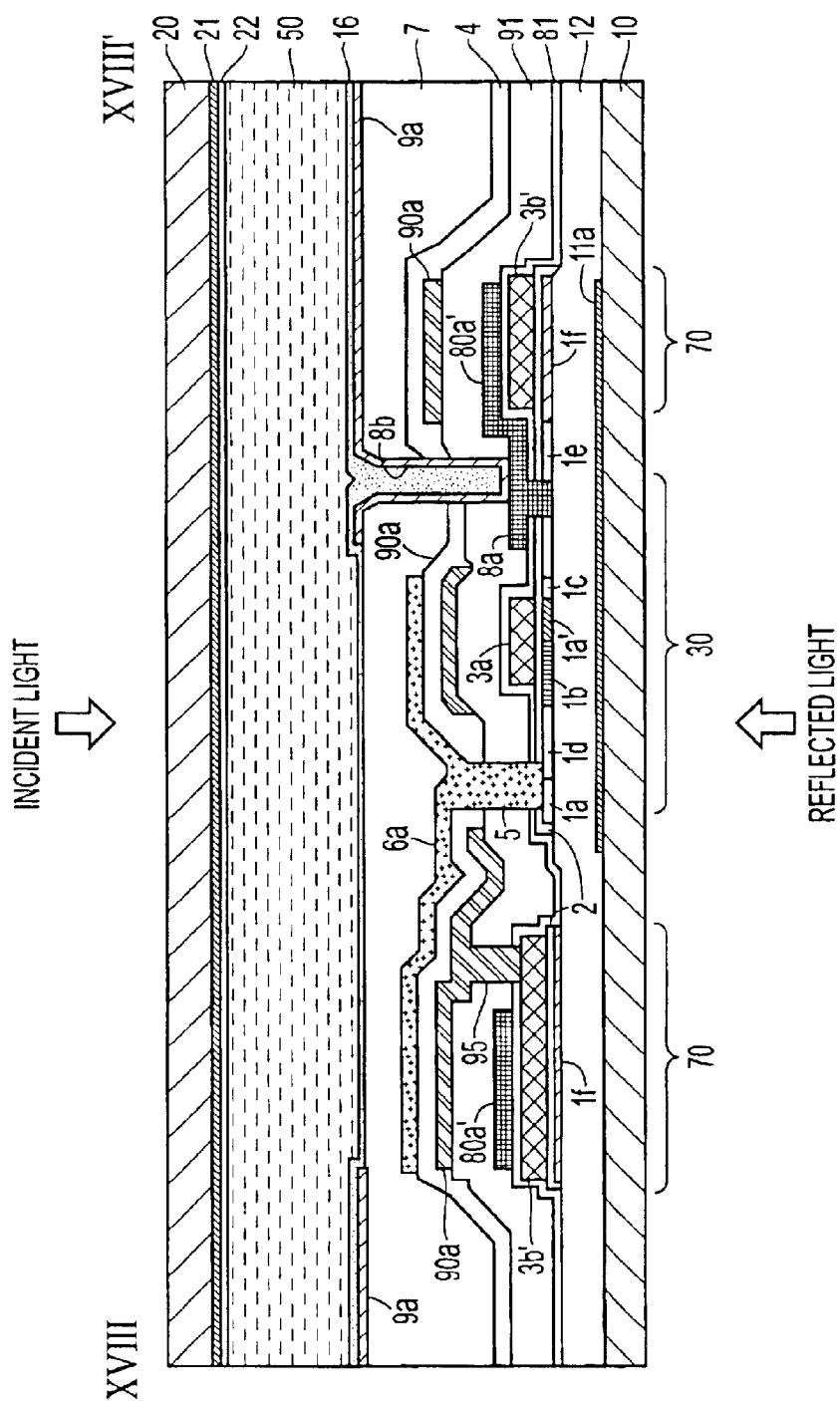
FIG. 18 is a sectional view taken along line XVIII-XVIII' in FIG. 17.

The construction of a liquid crystal device as an electro-optical device in accordance with a third embodiment of the present invention will be described with reference to FIGS. 17 and 18. FIG. 17 is a plan view of a plurality of adjacent pixel groups on a TFT array substrate on which data lines, scanning lines, pixel electrodes, etc. are formed, and FIG. 18 is a sectional view taken along line XVIII–XVIII' in FIG. 17. In FIG. 18, layers and members are shown on different reduction scales in order to make each of the layers and the members recognizable in the drawing.

As shown in FIG. 17, the third embodiment is greatly different from the first embodiment in that auxiliary wirings 3b' also serving as capacitor electrodes 3b are formed by the same film as scanning lines 3a. The auxiliary wirings 3b' are extended from an image display region to the periphery thereof along the direction of the scanning lines 3a so as to be connected to a constant potential source in the peripheral region. As the constant potential source, a constant potential source such as a negative power source, or a positive power source supplied to peripheral circuits for driving the liquid crystal device (for example, a scanning line driving circuit, a data line driving circuit), which will be described below, a ground power source, a constant potential source supplied to a counter electrode, or the like can be used. The auxiliary wirings 3b' preferably have the same potential as that supplied to light-shielding conductive films 90a. Therefore, the auxiliary wirings 3b' can be caused to function as parts of the capacitor lines 300 shown in FIG. 1. Also, the auxiliary wirings 3b' can be electrically connected to the upper light-shielding conductive films 90a below data lines 6a through contact holes 95. In this case, the auxiliary wirings 3b' may be connected to the light-shielding conductive films 90a through the contact holes 95 for each pixel electrode 9a or a plurality of the pixel electrodes 9a. In this way, the capacitor lines 300 having a redundant structure can be formed by the auxiliary wirings 3b' and the light-shielding conductive films 90a. Even when the first or second embodiment has a margin for the light-shielding regions, of course, the capacitor electrodes 3b may be extended to form the auxiliary wirings 3b'.

The third embodiment is also greatly different from the first embodiment in that relay films 80a' shown by slanted lines are formed so as not to overlap with the scanning lines 3a in a plan view, as shown in FIG. 17. As a result, the interlayer insulating film 81 is formed to a thickness of 100 nm or less so that large storage capacitors can be formed on the auxiliary wirings 3b' including capacitor electrodes, as shown in FIG. 18. Namely, the storage capacitors C2 shown in FIG. 4 can be enlarged. In this case, since the interlayer insulating film 81 for insulating the scanning lines 3a and the relay films 80a' is thinned, the relay films 80a' provided to overlap with the scanning lines 3a enlarge parasitic capacitances, thereby delaying scanning signals. Also, error occurs in the operation of the TFTs 30 due to the influence of a potential applied to the relay films 80a', and thus the relay films 80a' cannot be provided near channel regions 1a'. However, the interlayer insulating film 81 between the semiconductor layers 1a and the relay films 80a' can be greatly thinned, and thus no penetration in the semiconductor layers 1a occurs in forming contact holes 8a for electrically connecting heavily-doped drain regions 1e of the semiconductor layers 1a and the relay films 80a'. There is also the advantage that the aperture diameter of the contact holes 8a can be significantly decreased. Furthermore, in order that the channel regions 1a', the vicinities thereof and the scanning lines 3a are shielded by the light-shielding conductive films 90a, an interlayer insulating film 91 must be formed to a thickness of 500 nm or more. However, the storage capacitors C1 shown in FIG. 4 can be formed between the auxiliary wirings 3b' and the light-shielding conductive films 90a.

(Fourth Exemplary Embodiment)

Figure 19:
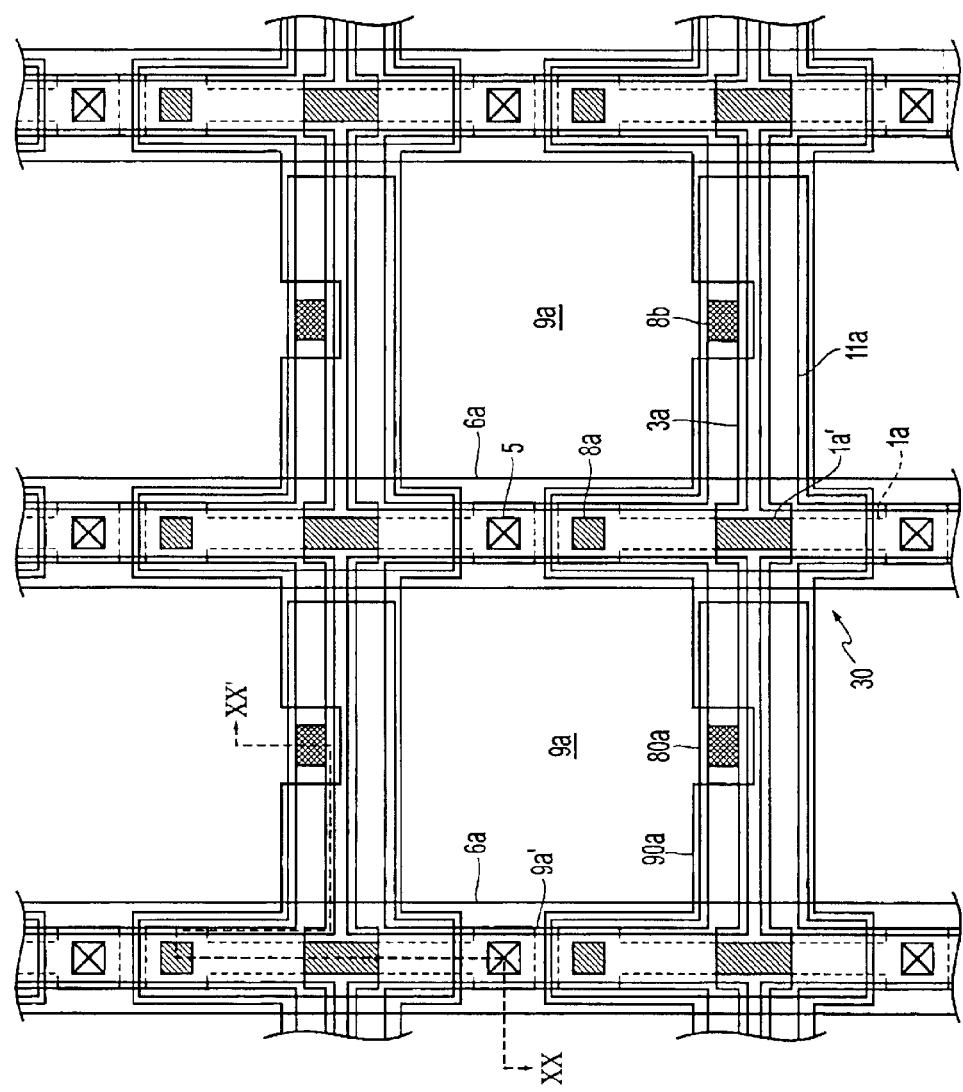
FIG. 19 is a plan view of a plurality of adjacent pixel groups of a TFT array substrate on which data lines, scanning lines, pixel electrodes, etc. are formed in the electro-optical device in accordance with a fourth exemplary embodiment.
Figure 20:
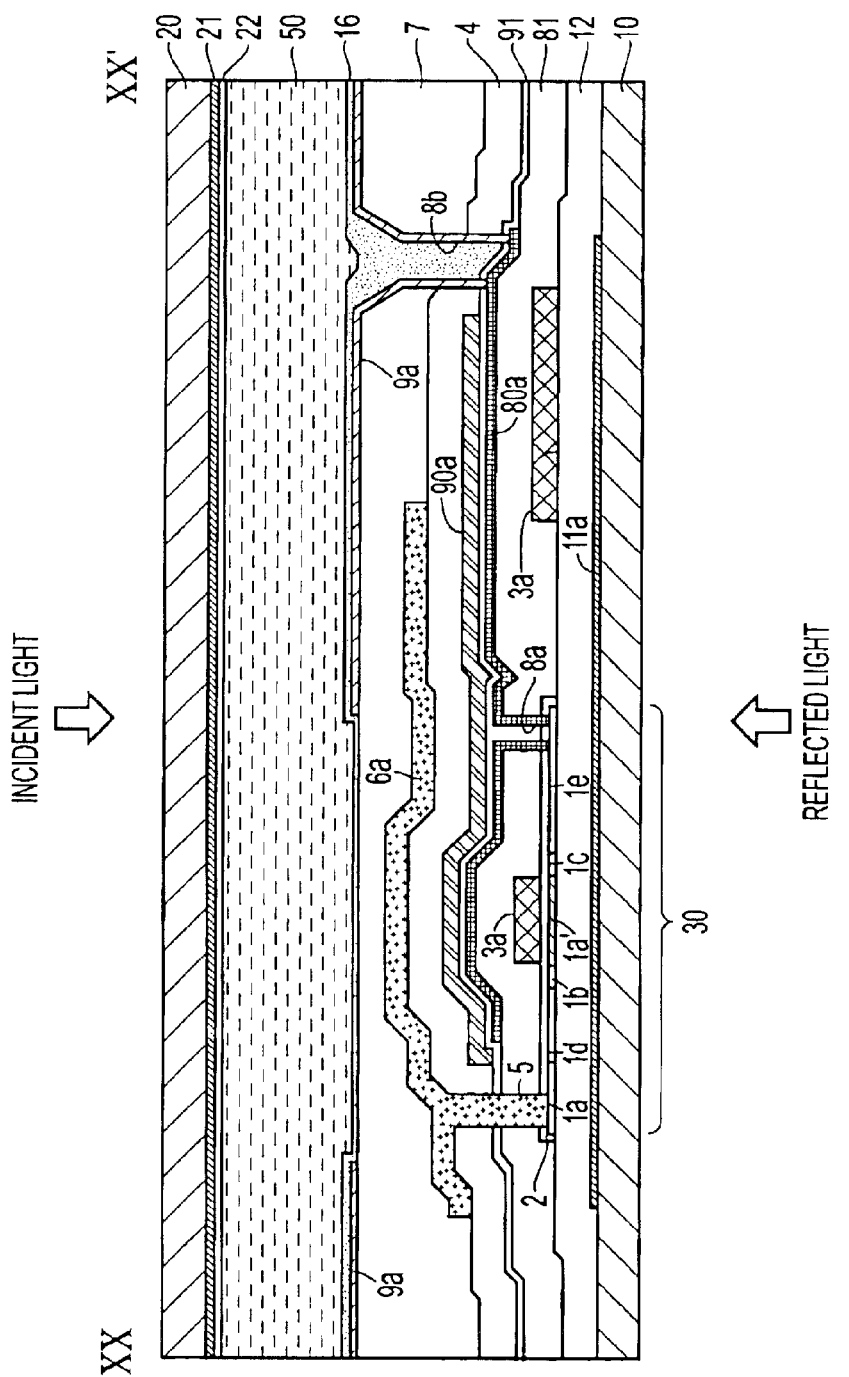
FIG. 20 is a sectional view taken along line XX-XX' in FIG. 19.

The construction of a liquid crystal device as an electro-optical device in accordance with a fourth embodiment of the present invention will be described with reference to FIGS. 19 and 20. FIG. 19 is a plan view of a plurality of adjacent pixel groups on a TFT array substrate on which data lines, scanning lines, pixel electrodes, etc. are formed, and FIG. 20 is a sectional view taken along line XX-XX' in FIG. 19. In FIG. 20, layers and members are shown on different reduction scales in order to make each of the layers and the members recognizable in the drawing. The same members as the first embodiment are denoted by the same reference numerals, and description thereof is omitted.

In the fourth embodiment, as shown in FIG. 19, scanning lines 3a and data lines 6a are provided in substantially centers of non-aperture regions. Semiconductor layers 1a are provided below the data lines 6a so as to cross the scanning lines 3a. As shown in FIG. 20, the data lines 6a are electrically connected to heavily-doped source regions 1d of the semiconductor layers 1a below the data lines 6a through contact holes 5. The heavily-doped drain regions 1e of the semiconductor layers 1a are electrically connected to the relay films 80a below the data lines through contact holes 8a. In this way, the semiconductor layers 1a are arranged below the light-shielding data lines 6a to exhibit the effect of preventing direct incidence of light from the counter substrate 20 side on the semiconductor layers 1a. Furthermore, the semiconductor layers 1a and the contact holes 5 and 8a are formed in line symmetry with respect to the center lines of the non-aperture regions in the direction of the scanning lines 3a and the non-aperture regions in the direction of the data lines 6a, thereby making the shape of steps symmetric with respect to the data lines. This embodiment is thus advantageous because no difference occurs in light transmission according to the rotation direction of the liquid crystal.

Furthermore, underlying light-shielding films 11a are formed below the semiconductor layers 1a with an underlying insulating film 12 provided therebetween. The underlying light-shielding films 11a are formed in a matrix along the direction of the data lines 6a and the direction of the scanning lines 3a. The semiconductor layers 1a are arranged inward of the underlying light-shielding films 11a, thereby causing the effect of preventing direct incidence of light returned from the TFT array substrate 10 side on the semiconductor layers 1a.

The relay films 80a may consist of a polysilicon film, or a conductive film containing a high-melting-point metal or the like, and are extended in a substantially T shape along the scanning lines 3a and the data lines 6a between the semiconductor layers 1a and the pixel electrodes 9a so as to function as buffers for electrically connecting the semiconductor layers 1a and the pixel electrodes 9a. More specifically, the heavily-doped drain regions 1e of the semiconductor layers 1a are electrically connected to the conductive relay films 80a through the contract holes 8a, and the relay films 80a are electrically connected to the pixel electrodes 9a through the contact holes 8b. In this structure, by providing the relay films 80a having a high etching selection ratio, it is possible to avoid the possibility of penetration in the semiconductor layers 1a during the formation of the contact holes. In the contact holes 5 for electrically connecting the data lines 6a and the heavily-doped source regions 1d of the semiconductor layers 1a, the same films as the relay films 80a may be provided for relay.

In the fourth embodiment, an interlayer insulating film 91 is laminated on the relay films 80a, and the light-shielding conductive films 90a are formed on the interlayer insulating film 91. The light-shielding conductive films 90a are formed to cover the relay films 80a except the contact holes 8b. The light-shielding conductive films 90a are also extended to the outside of the image display region in the direction of the scanning lines 3a so as to be electrically connected to any one of a constant potential source such as a negative power source, a positive power source supplied to a scanning line driving circuit, a data line driving circuit, etc., a ground power source, a constant potential source supplied to a counter electrode, or the like, thereby fixing the potential. Therefore, each of the relay films 80a can be used as one of capacitor electrodes, and each of the light-shielding conductive films 90a can be used as the other capacitor electrode to form each of the storage capacitors C1 shown in FIGS. 4 and 5. In this embodiment, of course, the interlayer insulating film 91 functions as a dielectric film. Since the interlayer insulating film 91 is laminated only for forming the storage capacitors C1, the interlayer insulating film 91 is thinned to a thickness which causes no leakage between the relay films 80a and the light-shielding conductive films 90a, thereby increasing the storage capacitors C1. Furthermore, in the fourth embodiment, the relay films 80a can be extended to portions above the TFTs 30 and the scanning lines 3a by thickening the interlayer insulating film 81, thereby efficiently increasing the storage capacitors C1. Furthermore, in the fourth embodiment, the semiconductor layers 1a are not extended to form capacitor electrodes. Therefore, capacitor electrodes for forming the storage capacitors and capacitor lines need not be formed by using the same film as the scanning lines 3a, and thus the scanning lines 3a can be formed at the substantially centers of the non-aperture regions defined by the light-shielding conductive films 90a and the underlying light-shielding films 11a, as shown in FIG. 19. Also, the semiconductor layers 1a consisting of a polysilicon film need not be decreased in resistance, and thus impurities need not implanted into the capacitor electrode forming portions to decrease the number of steps.

In the fourth embodiment, the channel regions 1a' of the TFTs 30 are respectively formed at the intersections of the scanning lines 3a and the data lines 6a so that the channel regions 1a' can be formed at the substantially centers of the non-aperture regions in the direction of the data lines 6a and the direction of the scanning lines 3a. As a result, the channel regions 1a' are located at positions which are most hardly irradiated with light reflected by the counter substrate 20 side and light returned from the TFT array substrate 10 side, thereby significantly decreasing a leakage current of the TFTs 30 due to light.

Furthermore, in the fourth embodiment, as shown in FIG. 19, the light-shielding conductive films 90a, the relay films 80a and the underlying light-shielding films 11a are formed near the channel regions 1a' so that the pattern width decreases in this order, to prevent direct incidence of light on the underlying light-shielding films 11a. Also, the relay films 80a consisting of a polysilicon film are interposed between the light-shielding conductive films 90a and the semiconductor layers 1a to exhibit the effect of absorbing light reflected by the surfaces of the underlying light-shielding films 11a and light returned from the TFT array substrate 10 side. Therefore, this embodiment is useful for light resistance.

Furthermore, in the fourth embodiment, the non-aperture regions consisting of the data lines 6a, the light-shielding conductive films 90a, the underlying light-shielding films 11a, etc. can be formed on the TFT array substrate 10, whereby a light-shielding film need not be provided on the counter substrate 20. Therefore, since no light-shielding film is provided on the counter substrate 20, the regions (aperture regions) where light is transmitted is not changed even when alignment is shifted in mechanically combining the TFT array substrate 10 and the counter substrate 20. As a result, a stable pixel aperture ratio can be obtained, and defects of the device can be significantly decreased.

(Whole Construction of Electro-optical Device)

Figure 21:
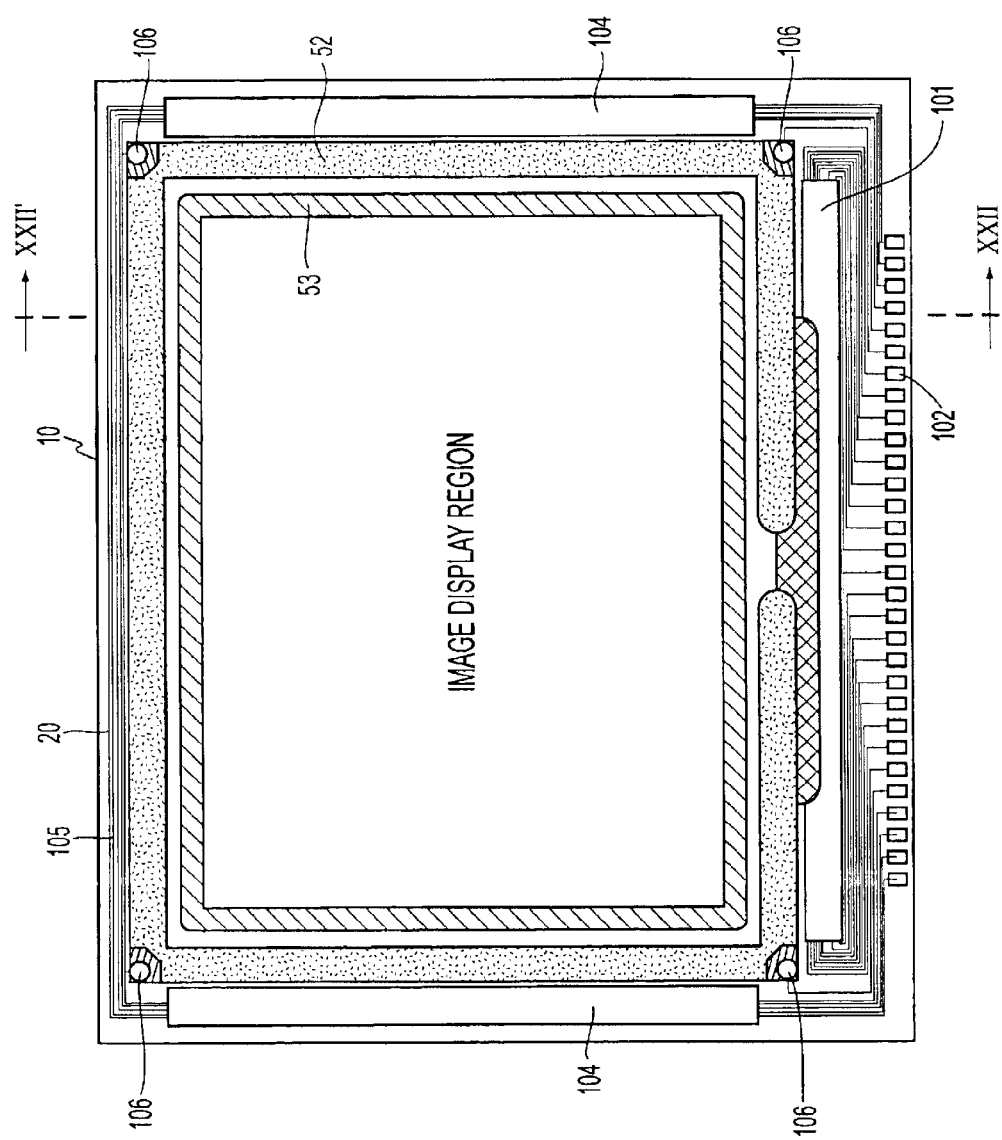
FIG. 21 is a plan view the TFT array substrate and the components formed thereon in a liquid crystal device in accordance with an exemplary embodiment, as viewed from the counter substrate side.
Figure 22:
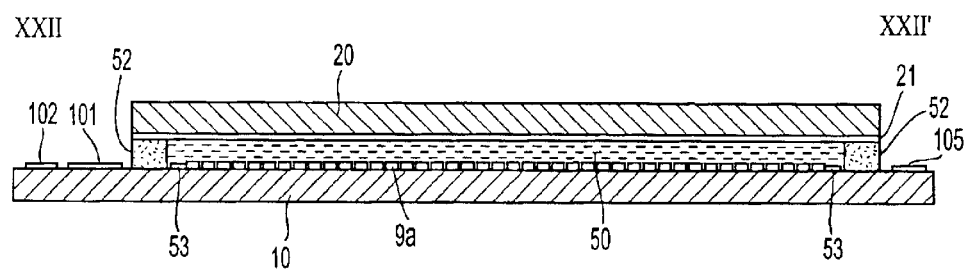
FIG. 22 is a sectional view taken along line XXII-XXII' in FIG. 21.

The whole construction of the liquid crystal device of each of the embodiments constructed as described above will be described with reference to FIGS. 21 and 22. FIG. 21 is a plan view showing the TFT array substrate 10 together with components formed thereon, as viewed from the counter substrate 20 side, and FIG. 22 is a sectional view taken along line XXII-XXII' in FIG. 21.

In FIG. 21, a sealing agent 52 is provided on the TFT array substrate 10, on which elements and wiring are formed, along the edge of the counter substrate 20, and a light-shielding frame 53 is provided in parallel to the inner side of the sealing agent, for defining the periphery of the image display region. The frame 53 may be provided on the TFT array substrate 10 side, like in this embodiment, or the counter substrate 20 side. In the region outside the sealing agent 52, a data line driving circuit 101 for supplying an image signal to the data lines 6a with predetermined timing and external circuit connecting terminals 102 are provided along one side of the TFT array substrate 10, and a scanning line driving circuit 104 is provided along each of the two sides adjacent to that side, for supplying a scanning signal to the scanning lines 3a with predetermined timing. When a delay of the scanning signal supplied to the scanning lines 3a is not a problem, of course, the scanning line driving circuit 104 may be provided on one side. Alternatively, the data line driving circuit 101 may be provided on both sides of the image display region along the sides thereof. Furthermore, a plurality of wirings 105 are provided on the remaining side of the TFT array substrate 10, for supplying a common signal to the scanning line driving circuits 104 provided on both sides of the image display region. Furthermore, a vertical conducting material 106 is provided at least one of the corners of the counter substrate 20, for providing electric conduction between the TFT array substrate 10 and the counter substrate 20. Namely, the counter electrode potential applied from the external circuit connecting terminals 102 is supplied to the counter electrode 21 provided on the counter substrate 20 through the wiring provided on the TFT array substrate 10 and the vertical conducting materials 106. As shown in FIG. 22, the counter substrate 20 is fixed to the TFT array substrate 10 with the sealing material 52. Besides the data line driving circuit 101 and the scanning line driving circuits 104, on the TFT array substrate 10 may be formed a sampling circuit for supplying an image signal to the plurality of the data lines 6a with predetermined timing, a pre-charging circuit for supplying a predetermined voltage level pre-charge signal to the plurality of the data lines 6a before the image signal, an inspection circuit for inspecting quality, defects, etc. of the liquid crystal device in the course of manufacture, at the time of shipping, and the like. In the liquid crystal device of this embodiment, the peripheral circuits such as the data line driving circuit 101, and the scanning line driving circuits 102 can be formed on the same TFT array substrate 10 in the step of forming the TFTs 30 for controlling the pixel electrodes 9a, thereby realizing a liquid crystal device having high definition and high density.

The TFT array substrate 10 may be electrically or mechanically connected to driving LSI mounted on, for example, a TAB (Tape Automated Bonding) substrate, through an anisotropic conductive film provided on the peripheral portion of the TFT array substrate 10 instead of providing the data line driving circuit 101 and the scanning line driving circuit 104 on the TFT array substrate 10. Furthermore, a polarizing film, a retardation file, a polarizer or the like may be arranged in the predetermined direction on each of the incident side of the counter substrate 20 and the outgoing side of the TFT array substrate 10 according to the operation mode such as a TN mode, a VA (Vertically Aligned) mode, a PDLC (Polymer Dispersed Liquid Crystal) mode, or the like, and the normally black mode/ normally white mode.

The liquid crystal device of each of the embodiments is used as each of three light valves for R (red), G (green) and B (blue) in order to apply to a color display projector, and light of each of the colors separated through a dichroic mirror for RGB color separation is incident on each of the light valves. Therefore, in each of the embodiments, a color filter is not provided on the counter substrate 20. However, a RGB color filter may be formed on the predetermined regions of the counter substrate 20, which correspond to the pixel electrodes 9a, together with a protecting film therefore. Alternatively, a color filter layer may be formed by using a color resist or the like below the pixel regions 9a on the TFT array substrate 10 corresponding to RGB. As a result, besides the projector, the liquid crystal device of each of the embodiments can be applied to color display liquid crystal devices such as direct-viewing type and reflection type color liquid crystal televisions. Furthermore, microlenses may be formed on the counter substrate 20 in one-to-one correspondence with pixels. By forming the microlenses, the converging efficiency of incident light can be significantly improved to realize a bright liquid crystal device. Furthermore, an interference layer consisting of layers having different refractive indexes may be deposited on the counter substrate 20 to form a dichroic filter for creating RGB colors by using light interference. By using the counter substrate including the dichroic filter, a liquid crystal device for brighter color display can be realized.

Although, in the liquid crystal device of each of the above-mentioned embodiments, like in a conventional device, incident light is incident on the counter substrate 20 side, light may be incident on the TFT array substrate 10 side, and light may be emitted from the counter substrate 20 side because the underlying light-shielding films 11a and the light-shielding conductive films 90a are provided on the TFT array substrate 10. Also, a polarizer coated with an AR (Anti Reflection) film need not be provided on or an AR film need not be mounted on the back of the TFT array substrate 10 in order to prevent reflection, thereby causing the advantage that the material cost can be accordingly reduced, and the yield is not reduced due to dust, flaws, etc. in mounting the polarizer. Furthermore, even when the efficiency of light utilization is improved by using a bright light source or polarization conversion with a polarization beam splitter, deterioration in image quality such as cross talk due to light does not occur because of the excellent light resistance. Although, in each of the embodiments, the conductive films 90a has the light shielding ability, the conductive films has no light shielding ability in some cases in which another light-shielding film is formed for light incident on the counter substrate side. Even with the conductive films 90a having no light shielding ability, the construction of each of the embodiments can enlarge the storage capacitors.

Furthermore, although a normal stagger type or coplanar type polysilicon TFT is used as a switching element provided in each of pixels, each of the embodiments is also effective for other types of TFTs such as a reversed stagger type TFT, an amorphous silicon TFT.

An electro-optical device of the present invention is not limited to the above-described embodiments, and appropriate modification can be made within the gist and idea of the present invention which can be read from the claims and the entire specification. An electro-optical device with such modification is also included in the technical field of the present invention.

What is claimed is:

1. An electro-optical device, comprising:
   a scanning line formed above a substrate;
   a data line crossing the scanning line;
   a thin film transistor disposed in correspondence with an intersection of the scanning line and the data line;
   a pixel electrode electrically connected to a drain region of the thin film transistor; and
   a first storage capacitor formed by a plurality of layers between a gate electrode of the thin film transistor and the data line.

2. The electro-optical device according to claim 1, the first storage capacitor includes:
   a first capacitor electrode;
   an insulating film facing the first capacitor electrode; and
   a second capacitor electrode arranged opposite to the first capacitor electrode with the insulating film provided therebetween to serve as a relay film for electrically connecting the drain region of the thin film transistor and the pixel electrode.

3. The electro-optical device according to claim 1, the first storage capacitor is formed to overlap with each of a semiconductor layer of the thin film transistor and the scanning line except a connection region between a source region of the thin film transistor and the data line.

4. The electro-optical device according to claim 2, further comprising:
   a second storage capacitor including:
      a second capacitor electrode;
      an insulating film facing the second capacitor electrode; and
      a third capacitor electrode opposed to the second capacitor electrode with the insulating film provided therebetween and including a same film as the gate electrode.

5. The electro-optical device according to claim 4, the third capacitor electrode is formed in parallel with the scanning line except in the connection region between the drain region of the thin film transistor and the second capacitor electrode.

6. The electro-optical device according to claim 4, the third capacitor electrode is electrically connected to the first capacitor electrode.

7. The electro-optical device according to claim 6, the electric connection between the third capacitor electrode and the first capacitor electrode is located in a region below the data line.

8. The electro-optical device according to claim 4, the third capacitor electrode comprises a part of a first capacitor lines extending along the scanning line, the first capacitor electrode includes a part of a second capacitor line extending along the scanning line, and the first and second capacitor lines are extended to the periphery of the image display region in which the pixel electrode is arranged, and electrically connected to each other.

9. The electro-optical device according to claim 4, further comprising:
a third storage capacitor including:
a third capacitor electrode;
an insulating film facing the third capacitor electrode; and
a fourth capacitor electrode opposed to the third capacitor electrode with the insulating film provided therebetween and including a same film as the semiconductor layer.

10. The electro-optical device according to claim 9, the fourth capacitor electrode is formed to extend from the drain region of the thin film transistor.

11. The electro-optical device according to claim 9, the fourth capacitor electrode is formed in parallel with the scanning line.

12. The electro-optical device according to claim 9, the capacity of the second storage capacitor is smaller than that of each of the first storage capacitor and the third storage capacitor.

13. The electro-optical device according to claim 4, further comprising:
a fourth storage capacitor including:
the fourth capacitor electrode including a same film as the semiconductor layer;
an insulating film facing the fourth capacitor electrode; and
a fifth capacitor electrode arranged opposite to the fourth capacitor electrode, with the insulating film provided therebetween, for shielding the semiconductor layer from light.

14. The electro-optical device according to claim 13, the fifth capacitor electrode is electrically connected to the first capacitor electrode in the periphery of the image display region.

15. The electro-optical device according to claim 2, further comprising:
a fifth storage capacitor including:
the first capacitor electrode;
an insulating film laminated on the first capacitor electrode; and
a sixth capacitor electrode arranged opposite to the first capacitor electrode with the insulating film provided therebetween to form the pixel electrode.

16. The electro-optical device according to claim 15, the fifth storage capacitor is formed over the entire periphery of each pixel.

17. An electro-optical device, comprising:
a scanning line formed above a substrate;
a data line formed above the substrate;
a thin film transistor disposed in correspondence with an intersection of the scanning line and the data line;
a pixel electrode electrically connected to a drain region of the thin film transistor; and
a storage capacitor having a first conductive film which forms at least one capacitor electrode of the storage capacitor, and a second conductive light-shielding film which forms another capacitor electrode and is arranged above a gate electrode of the thin film transistor, the second light-shielding conductive film electrically connecting a semiconductor layer constituting the drain region to the pixel electrode,
the second conductive light-shielding film covers at least portions of a channel region of the thin film transistor, a junction region between the source region and the channel region of the thin film transistor, a junction region between the drain region and the channel region of the thin film transistor, and the source and drain regions adjacent to the respective junction regions.

18. The electro-optical device according to claim 17, the first conductive film covers the channel region, and the data line is formed on the channel region and the adjacent region thereof so as not to project from the first conductive film in a plan view.

19. The electro-optical device according to claim 17, each of the first conductive film and the data line includes a film containing at least Al.

20. The electro-optical device according to claim 17, the first conductive film is extended from the image display region in which the pixel electrode is arranged to the periphery thereof, and connected to a constant potential source in the peripheral region.

21. An electro-optical device, comprising:
a scanning line formed above a substrate;
a data line formed above the substrate;
a thin film transistor disposed in correspondence with an intersection of the scanning line and the data line;
a pixel electrode electrically connected to a drain region of the thin film transistor; and
a storage capacitor having a first conductive file which forms at least one capacitor electrode of the storage capacitor, and a second conductive light-shielding film which forms another capacitor electrode and is arranged above a gate electrode of the thin film transistor, the second light-shielding conductive film electrically connecting a semiconductor layer constituting the drain region to the pixel electrode; and
a channel region of the thin film transistor covered with the data line arranged above the first conductive film with an insulating film formed therebetween.

22. An electro-optical device, comprising:
a scanning line formed above a substrate;
a data line formed above the substrate;
a thin film transistor disposed in correspondence with an intersection of the scanning line and the data line;
a pixel electrode electrically connected to a drain region of the thin film transistor;
a storage capacitor having a first conductive film which forms at least one capacitor electrode of the storage capacitor, and a second conductive film which forms another capacitor electrode and is arranged above a gate electrode of thin film transistor, the second conductive film electrically connecting a semiconductor layer constituting the drain region to the pixel electrode; and
a third conductive film which includes a same film as the gate electrode, and which is arranged opposite to the second conductive film with an interlayer insulating film formed therebetween, the first conductive film and the third conductive film being electrically connected to each other by the first conductive film and the third conductive film directly contacting each other.

23. The electro-optical device according to claim 22, the first conductive film and the third conductive film being electrically connected to each other, and the second conductive film and a fourth conductive film being electrically connected to each other.

24. The electro-optical device according to claim 22, the third conductive film includes a capacitor line which is extended from the image display region to the periphery thereof along the scanning line, and connected to a constant potential source in the peripheral region, the first conductive film being connected to the capacitor line.

25. The electro-optical device according to claim 24, the underlying light-shielding film includes a light-shielding conductive film, and is connected to the capacitor line of each pixel.

26. An electro-optical device, comprising:
    a scanning line formed above a substrate;
    a data line formed above the substrate;
    a thin film transistor disposed in correspondence with an intersection of the scanning line and the data line;
    a pixel electrode electrically connected to a drain region of the thin film transistor; and
    a storage capacitor having a first conductive film which forms at least one capacitor electrode of the storage capacitor, and a second conductive light-shielding film which forms another capacitor electrode and is arranged above a gate electrode of the thin film transistor, the second light-shielding conductive film electrically connecting a semiconductor layer constituting the drain region to the pixel electrode,
    the first conductive film includes a film having a lower reflectance than the data line.

27. The electro-optical device according to claim 26, further comprising:
    an underlying light-shielding film which is arranged below the semiconductor layer on the substrate and which is formed to cover at least the channel region as viewed from the opposite side of the substrate, and not to project from the first conductive film in a plan view of the channel region and the adjacent region thereof.

28. The electro-optical device according to claim 27, at least either of the first conductive film and the underlying light-shielding film is made of a high-melting-point metal.

29. The electro-optical device according to claim 26, the first conductive film has substantially the same size as the second conductive film under the data line.

30. A projection display device, comprising:
    an electro-optical device including:
        a scanning line formed above a substrate;
        a data line crossing the scanning line;
        a thin film transistor disposed in correspondence with an intersection of the scanning line and the data line;
        a pixel electrode electrically connected to a drain region of the thin film transistor; and
        a first storage capacitor formed by a plurality of layers between a gate electrode of the thin film transistor and the data line; and
    a projection device that projects a light passing through the electro-optical device.

31. An electrode-optical device, comprising:
    a scanning line formed above a substrate;
    a data line formed above the substrate;
    a thin film transistor disposed in correspondence with an intersection of the scanning line and the data line;
    a pixel electrode electrically connected to a drain region of the thin film transistor; and
    a storage capacitor having a first conductive light-shielding film which forms one of capacitor electrodes of the storage capacitor, is arranged below the pixel electrode, and a second conductive film which forms another capacitor electrode, is arranged above a gate electrode of the thin film transistor and below the first conductive light-shielding film, the second conductive film electrically connecting a semiconductor layer constituting the drain region to the pixel electrode,
    the first conductive light-shielding film and the second conductive film covering at least portions of a channel region of the thin film transistor, a first junction region between the source region and the channel region of the thin film transistor, a second junction region between the drain region and the channel region of the thin film transistor, the source and drain regions respectively adjacent to the first junction region and the second junction region, a scanning line region and a data line region.

* * * * *